United States Patent
Jeon et al.

(10) Patent No.: US 12,426,396 B2
(45) Date of Patent: Sep. 23, 2025

(54) IMAGE SENSOR WITH STACK STRUCTURE IN WHICH TWO SEMICONDUCTOR CHIPS ARE COMBINED WITH EACH OTHER

(71) Applicant: SAMSUNG ELECTRONICS CO., LTD., Suwon-si (KR)

(72) Inventors: Jinju Jeon, Suwon-si (KR); Youngwoo Chung, Yongin-si (KR); Hanseok Kim, Seoul (KR); Heegeun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 544 days.

(21) Appl. No.: 17/836,108

(22) Filed: Jun. 9, 2022

(65) Prior Publication Data

US 2022/0415954 A1    Dec. 29, 2022

(30) Foreign Application Priority Data

Jun. 25, 2021    (KR) .......................... 10-2021-0083099

(51) Int. Cl.
*H10F 39/00* (2025.01)
*H10F 39/12* (2025.01)

(52) U.S. Cl.
CPC .......... *H10F 39/811* (2025.01); *H10F 39/199* (2025.01); *H10F 39/807* (2025.01)

(58) Field of Classification Search
CPC ........... H01L 27/14636; H01L 27/1463; H01L 27/1464
USPC ....................................................... 257/148
See application file for complete search history.

(56) References Cited

U.S. PATENT DOCUMENTS

| | | |
|---|---|---|
| 9,373,656 B2 | 6/2016 | Park |
| 9,515,111 B2 | 12/2016 | Borthakur et al. |
| 9,741,759 B2 | 8/2017 | Park |
| 10,186,541 B2 | 1/2019 | Kim et al. |
| 10,672,823 B2 | 6/2020 | Shin et al. |
| 2014/0099772 A1* | 4/2014 | Chetlur ............. H01L 21/76224 438/430 |

(Continued)

FOREIGN PATENT DOCUMENTS

| | | |
|---|---|---|
| KR | 20150105076 A | 9/2015 |
| KR | 20170068310 A | 6/2017 |

*Primary Examiner* — Matthew C Landau
*Assistant Examiner* — Colin Russell McCutcheon
(74) *Attorney, Agent, or Firm* — FINNEGAN, HENDERSON, FARABOW, GARRETT & DUNNER LLP

(57) ABSTRACT

An image sensor includes: a first semiconductor chip having a pixel region, a peripheral region, and a first wiring layer; and a second semiconductor chip combined with the first semiconductor chip, and including a second wiring layer, wherein the pixel region includes an active pixel region and a dummy pixel region, wherein the pixels are separated from one another by deep trench isolations (DTI) passing through a silicon layer, wherein a backside contact applying a negative (−) voltage to a conductive layer of each of the DTIs is arranged in the dummy pixel region and passes through the silicon layer, wherein the backside contact contacts the conductive layer of each of the DTIs, and wherein a through via is formed in the peripheral region, and wiring lines of the first wiring layer are connected to wiring lines of a second wiring layer through the through via.

20 Claims, 14 Drawing Sheets

(56) References Cited

U.S. PATENT DOCUMENTS

| | | | |
|---|---|---|---|
| 2015/0228584 A1* | 8/2015 | Huang | H01L 25/50 |
| | | | 438/618 |
| 2017/0170229 A1* | 6/2017 | Oh | H01L 27/14603 |
| 2017/0338268 A1* | 11/2017 | Mitsuhashi | H01L 27/14636 |
| 2019/0148438 A1* | 5/2019 | Lee | H01L 27/14641 |
| | | | 257/432 |
| 2019/0148439 A1* | 5/2019 | Shin | H01L 27/1463 |
| | | | 257/443 |
| 2019/0198426 A1* | 6/2019 | Choi | H01L 21/3212 |
| 2020/0119067 A1 | 4/2020 | Choi | |
| 2020/0227455 A1 | 7/2020 | Lee et al. | |
| 2020/0303430 A1 | 9/2020 | Oh et al. | |
| 2021/0043792 A1 | 2/2021 | Iwata | |

* cited by examiner

IMAGE SENSOR WITH STACK STRUCTURE IN WHICH TWO SEMICONDUCTOR CHIPS ARE COMBINED WITH EACH OTHER

CROSS-REFERENCE TO RELATED APPLICATION

This application claims priority under 35 U.S.C. § 119 to Korean Patent Application No. 10-2021-0083099, filed on Jun. 25, 2021, in the Korean Intellectual Property Office, the disclosure of which is incorporated by reference herein in its entirety.

TECHNICAL FIELD

The present inventive concept relates to an image sensor, and more particularly, to an image sensor with a stack structure in which two semiconductor chips are combined with each other.

DISCUSSION OF THE RELATED ART

In general, an image sensor may include a pixel region and a logic region. A plurality of pixels are arranged in the pixel region in a two-dimensional array structure, and a unit pixel may include one photodiode and pixel transistors. The pixel transistors may include, for example, a transfer transistor, a reset transistor, a source follower transistor, and a selection transistor. Logic elements for processing pixel signals transmitted from the pixel region ma be arranged in the logic region. Currently, an image sensor in which each of a pixel region and a logic region is formed in a semiconductor chip, and two semiconductor chips are stacked on each other is under development. In the image sensor with the stack structure, the number of pixels in the pixel region may be increased and the performance of logic elements in the logic region may be increased. Therefore, an image sensor with relatively high picture quality and reliability may be implemented.

SUMMARY

According to an exemplary embodiment of the present inventive concept, an image sensor with a stack structure includes: a first semiconductor chip having a pixel region, a peripheral region adjacent to the pixel region, and a first wiring layer, wherein a plurality of pixels are arranged in an array structure in the pixel region; and a second semiconductor chip combined with the first semiconductor chip through an adhesive layer, wherein logic elements are disposed on the second semiconductor chip, and wherein the second semiconductor chip includes a second wiring layer, wherein the pixel region includes an active pixel region and a dummy pixel region at least partially surrounding the active pixel region, wherein the plurality of pixels are separated from one another by deep trench isolations (DTI) passing through a silicon layer, wherein the silicon layer is in the pixel region and the peripheral region, wherein a backside contact configured to apply a negative (−) voltage to a conductive layer of each of the DTIs is arranged in the dummy pixel region and passes through the silicon layer, wherein the backside contact contacts the conductive layer of each of the DTIs while passing through the silicon layer, and wherein a through via is formed in the peripheral region, and wiring lines of the first wiring layer are connected to wiring lines of a second wiring layer through the through via.

According to an exemplary embodiment of the present inventive concept, an image sensor with a stack structure includes: a first semiconductor chip including a first semiconductor substrate, a first wiring layer disposed on the first semiconductor substrate, and a backside contact passing through the first semiconductor substrate and extending into the first wiring layer, wherein the first semiconductor substrate includes a pixel region and a peripheral region, wherein a plurality of pixels are arranged in a two-dimensional array structure in the pixel region, and wherein the peripheral region is adjacent to the pixel region; a second semiconductor chip combined with the first semiconductor chip through an adhesive layer and including a second semiconductor substrate and a second wiring layer disposed on the second semiconductor substrate, wherein logic elements are formed on the second semiconductor substrate; and a through via passing through the first semiconductor substrate and the first wiring layer and extending into the second wiring layer in the peripheral region and connecting wiring lines of the first wiring layer to wiring lines of the second wiring layer, wherein the pixel region includes an active pixel region and a dummy pixel region at least partially surrounding the active pixel region, and the backside contact is arranged in the dummy pixel region, wherein the plurality of pixels are separated from one another by deep trench isolations (DTI) passing through the first semiconductor substrate in the pixel region, and wherein a side of the backside contact contacts a conductive layer of each of the DTIs.

According to an exemplary embodiment of the present inventive concept, an image sensor with a stack structure includes: a first semiconductor chip in which logic elements are arranged; and a second semiconductor chip stacked on the first semiconductor chip and having a plurality of pixels arranged therein, wherein the logic elements and a plurality of pixels are electrically connected to each other through a through via, wherein a negative (−) voltage is applied to a conductive layer of each of deep trench isolations (DTI) separating the plurality of pixels from one another through a backside contact, and wherein the backside contact includes a pillar shape, and a side of the backside contact contacts a conductive layer of each of the DTIs.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
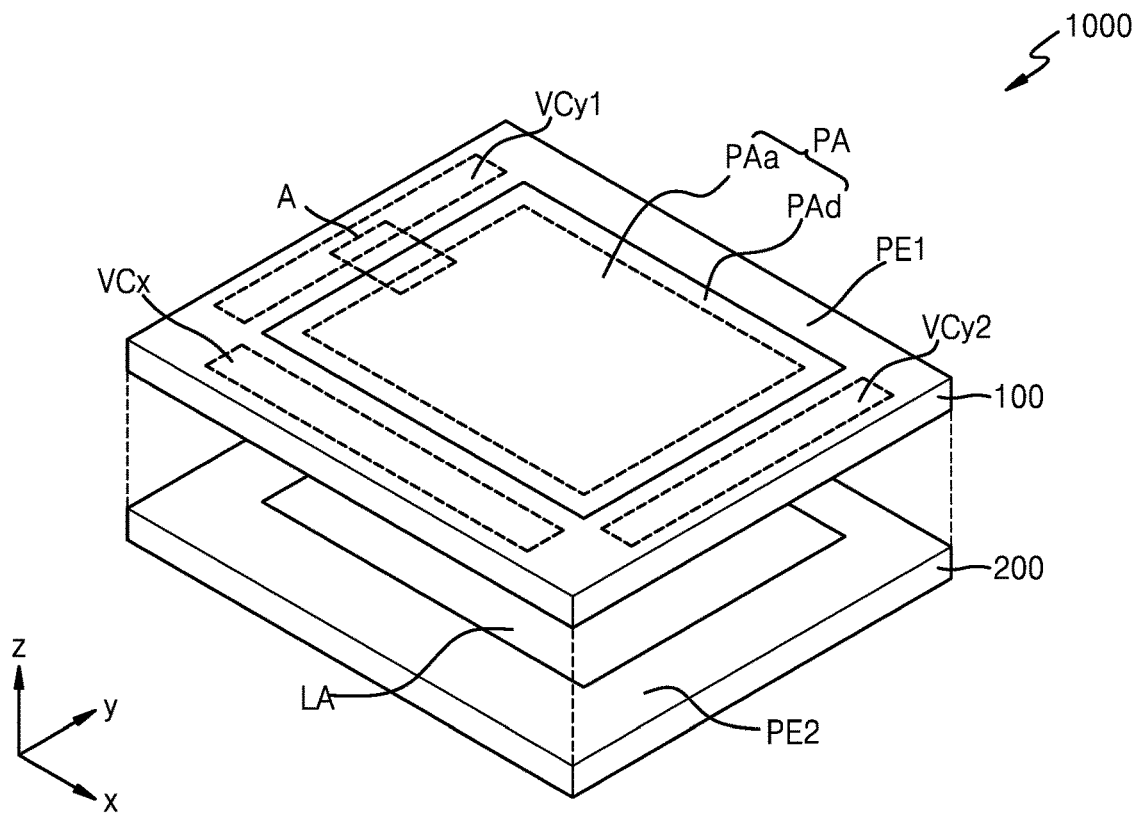
FIG. 1 is an exploded perspective view illustrating an image sensor with a stack structure in which a first semiconductor chip is separate from a second semiconductor chip according to an exemplary embodiment of the present inventive concept.

Exemplary embodiments of the present inventive concept will be described in detail with reference to the accompanying drawings. It is to be understood that like reference numerals refer to like elements throughout the specification, and thus, repetitive descriptions may be omitted.

Figure 2A:
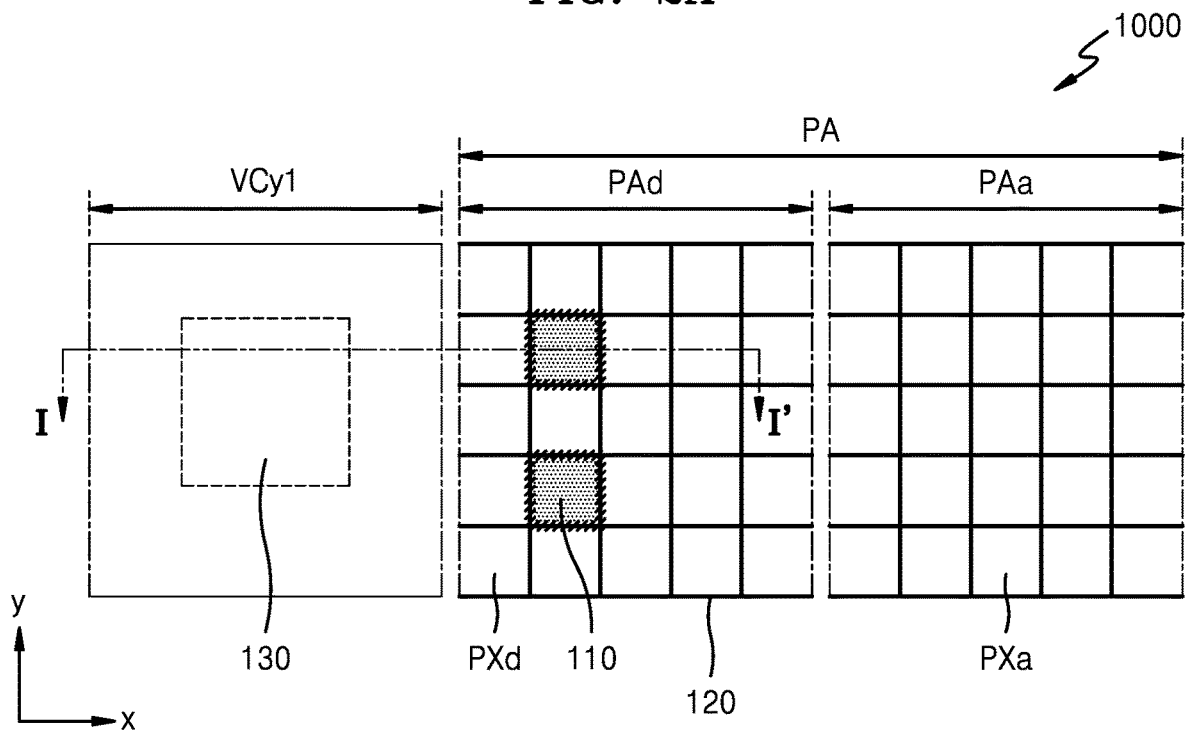
FIGS. 2A and 2B are, respectively, a plan view and a cross-sectional view illustrating an enlarged portion A of the image sensor with the stack structure of FIG. 1.
Figure 2B:
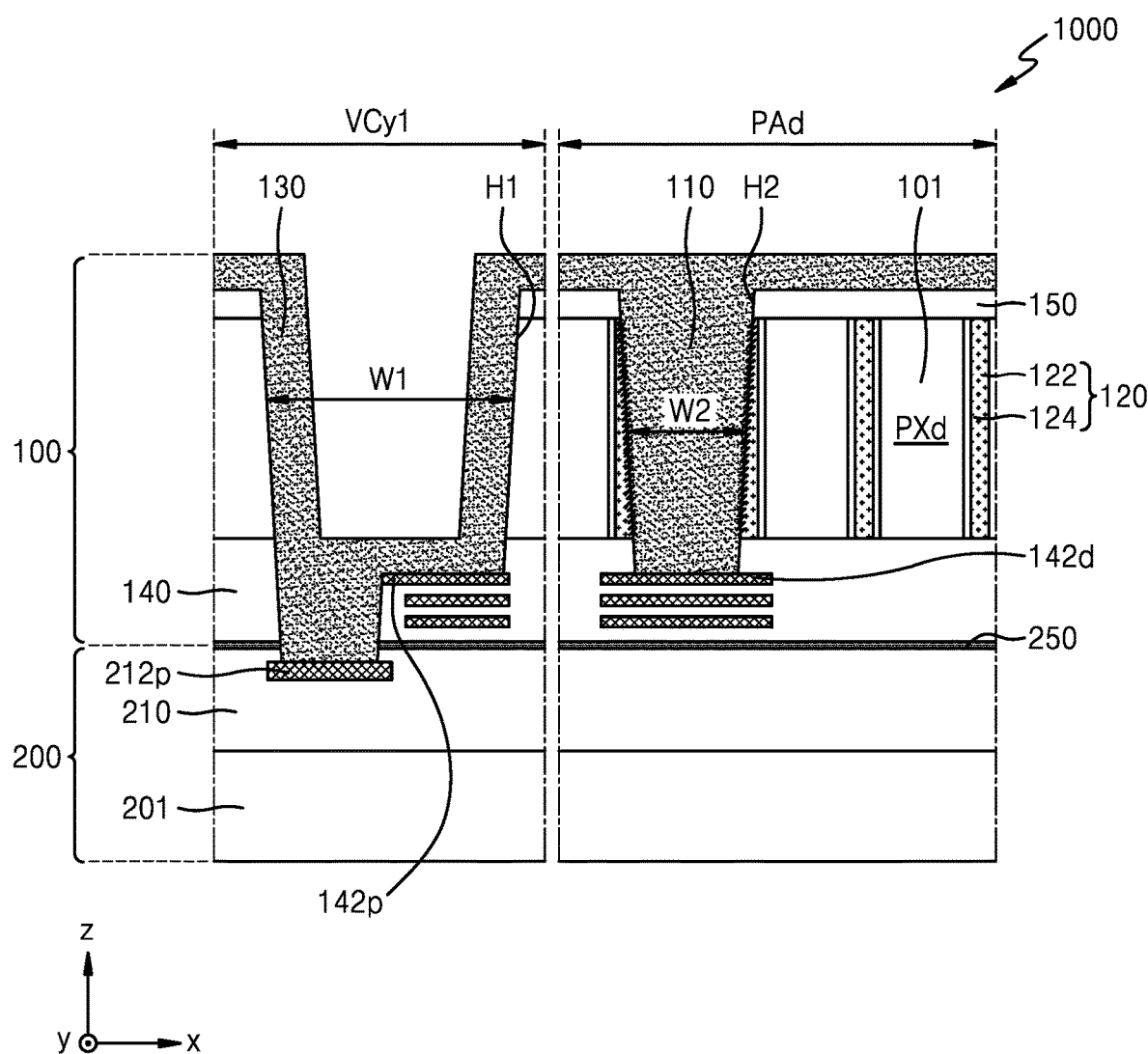

FIG. 1 is an exploded perspective view illustrating an image sensor with a stack structure 1000 in which a first semiconductor chip 100 is separate from a second semiconductor chip 200 according to an exemplary embodiment of the present inventive concept. FIGS. 2A and 2B are a plan view and a cross-sectional view illustrating an enlarged portion A of the image sensor with the stack structure 1000 of FIG. 1. FIG. 2B is a cross-sectional view taken along the line I-I' of FIG. 2A.

Referring to FIGS. 1 to 2B, the image sensor with the stack structure 1000 (hereinafter, referred to as 'the image sensor') according to the current embodiment may include the first semiconductor chip 100 and the second semiconductor chip 200. The image sensor 1000 according to the current embodiment may have a structure in which the first semiconductor chip 100 is stacked on the second semiconductor chip 200. The image sensor 1000 according to the current embodiment may be, for example, a complementary metal-oxide-semiconductor (CMOS) image sensor (CIS).

The first semiconductor chip 100 may include a pixel region PA and a first peripheral region PE1. The first peripheral region PE1 may at least partially surround the pixel region PA. For example, the pixel region PA may be arranged in a central region of the first semiconductor chip 100, and a plurality of active and dummy pixels PXa and PXd may be arranged in the pixel region PA in a two-dimensional array structure. The pixel region PA may include an active pixel region PAa and a dummy pixel region PAd. For example, the active pixel region PAa may be disposed in a central region of the array structure and the dummy pixel region PAd may at least partially surround the active pixel region PAa. The plurality of active pixels PXa may be arranged in the active pixel region PAa, and the plurality of dummy pixels PXd may be arranged in the dummy pixel region PAd.

The first peripheral region PE1 may be arranged outside the pixel region PA. For example, the first peripheral region PE1 may be arranged outside of the pixel region PA to at least partially surround four sides of the pixel region PA. However, according to an exemplary embodiment of the present inventive concept, the first peripheral region PE1 may be arranged outside only two or three sides of the pixel region PA. Row and column through via regions VCx, VCy1, and VCy2 may be arranged in the first peripheral region PE1. A plurality of through vias 130 may be arranged in the row and column through via regions VCx, VCy1, and VCy2. The plurality of through vias 130 may be connected to the plurality of active and dummy pixels PXa and PXd of the pixel region PA through wiring lines of a first wiring layer 140 of the first semiconductor chip 100. In addition, the plurality of through vias 130 may connect the wiring lines of the first wiring layer 140 of the first semiconductor chip 100 to wiring lines of a second wiring layer 210 of the second semiconductor chip 200. The wiring lines of the second wiring layer 210 of the second semiconductor chip 200 may be connected to a plurality of logic elements of a logic region LA of the second semiconductor chip 200. A structure of each of the plurality of through vias 130 will be described in more detail with reference to FIGS. 2A and 2B.

The row and column through via regions VCx, VCy1, and VCy2 may include the row through via region VCx extending in a first direction (e.g., an x direction) and the first and second column through via regions VCy1 and VCy2 extending in a second direction (e.g., a y direction). For example, the first and second column through via regions VCy1 and VCy2 may include the first column through via region VCy1 on the left side (or, e.g., a first side) of the pixel region PA and the second column through via region VCy2 on the right side (or, e.g., a second side) of the pixel region PA. According to an embodiment of the present inventive concept, one of the first column through via region VCy1 and the second column through via region VCy2 may be omitted.

As noted from FIG. 2B, in a vertical structure in a third direction (e.g., a z direction), a first semiconductor substrate 101 may be positioned in an upper portion of the first semiconductor chip 100, and the first wiring layer 140 may be positioned in a lower portion of the first semiconductor chip 100. For example, the first semiconductor chip 100 may be positioned above the first wiring layer 140. The first semiconductor substrate 101 may include, for example, silicon (Si). However, a material of the first semiconductor substrate 101 is not limited to Si. For example, the first semiconductor substrate 101 may include a single element semiconductor such as germanium (Ge) or a compound semiconductor such as silicon carbide (SiC), gallium arsenide (GaAs), indium arsenide (InAs), or indium phosphide (InP) Pixels may be formed in the first semiconductor substrate 101. A pixel, for example, an active pixel arranged in the first semiconductor substrate 101 will be described in more detail with reference to FIGS. 3A and 3B.

The first wiring layer 140 may be arranged under the first semiconductor substrate 101 and may include, for example, a first interlayer insulating layer and wiring lines. For example, wiring lines of different layers may be connected to one another through vertical contacts. In FIG. 2B, three-layered wiring lines are illustrated. However, the number of layers of the wiring lines is not limited to 3. In addition, the wiring lines may be connected to the pixels of the active pixel region PAa.

Color filters and micro-lenses may be formed in an upper portion of the first semiconductor substrate 101 or above the first semiconductor substrate 101. A structure in which the color filters and the micro-lenses are formed in an opposite direction to the first wiring layer 140 based on the first semiconductor substrate 101 in which the pixels are formed is referred to as a back side illumination (BSI) structure. In addition, a structure in which the color filters and the micro-lenses are formed in the same direction as the first wiring layer 140 based on the first semiconductor substrate 101, that is, the color filters and the micro-lenses are formed on the first wiring layer 140 is referred to as a front side illumination (FSI) structure. Therefore, in the image sensor 1000 according to the current embodiment, the first semiconductor chip 100 may have the BSI structure.

The second semiconductor chip 200 may include the logic region LA and a second peripheral region PE2. The logic region LA may be arranged in a central region of the second semiconductor chip 200, and the plurality of logic elements may be arranged in the logic region LA. The plurality of logic elements may include various elements for processing pixel signals from the pixels of the first semiconductor chip 100. For example, the plurality of logic elements may include an analog signal processing element, an analog-to-digital converter (ADC), an image signal processing element, and a control element. However, the plurality of logic elements included in the logic region LA are not limited thereto. For example, an element for supplying power or ground to the pixels or passive elements such as a resistor and a capacitor may be included in the logic region LA.

The second peripheral region PE2 may be arranged outside the logic region LA to at least partially surround the logic region LA. For example, the second peripheral region PE2 may be arranged outside the logic region LA to at least partially surround four sides of the logic region LA. However, according to an exemplary embodiment of the present inventive concept, the second peripheral region PE2 may be arranged outside only two or three sides of the logic region LA. In addition, through via regions may also be arranged in the second peripheral region PE2 to correspond to the row and column through via regions VCx, VCy1, and VCy2 of the first semiconductor chip 100, For example, the through via regions of the second peripheral region PE2 may respectively overlap the row and column through via regions VCx, VCy1, and VCy2 of the second semiconductor chip 100.

As illustrated in FIG. 2B, in a vertical structure in the third direction (e.g., the z direction), a second semiconductor substrate 201 may be positioned in a lower portion of the second semiconductor chip 200, and the second wiring layer 210 may be positioned in an upper portion of the second semiconductor chip 200. For example, the second wiring layer 210 may positioned above the second semiconductor substrate 201. The second semiconductor substrate 201 may also include, for example, Si. However, a material of the second semiconductor substrate 201 is not limited to Si. The plurality of logic elements may be formed in the second semiconductor substrate 201.

For example, the second wiring layer 210 may be arranged on the second semiconductor substrate 201 and may include second interlayer insulating layers and wiring lines. In FIG. 2B, for convenience sake, a one-layered wiring line is illustrated. However, multilayered wiring lines may be arranged in the second wiring layer 210. The wiring lines of the second wiring layer 210 may be connected to the plurality of logic elements of the logic region LA. In addition, the wiring lines of the second wiring layer 210 may be connected to the wiring lines of the first wiring layer 140 through the plurality of through vias 130.

According to an exemplary embodiment of the present inventive concept, the second semiconductor chip 200 may further include a memory region. Memory elements may be arranged in the memory region. For example, the memory elements may include dynamic random access memory (DRAM) and/or magnetic random access memory (MRAM). Therefore, in the memory region, a plurality of DRAM cells and/or a plurality of MRAM cells may be arranged in the two-dimensional array structure. In addition, when the second semiconductor chip 200 includes the memory region, the memory elements of the memory region may be formed together with the logic elements of the logic region. For example, the logic elements of the logic region and the memory elements of the memory region may be formed together through a CMOS process. For reference, the memory elements of the memory region may be used as image buffer memory for storing a frame image.

As illustrated in FIG. 1, the second semiconductor chip 200 may be arranged under the first semiconductor chip 100 and may be combined with the first semiconductor chip 100 through an adhesive layer 250. For example, the first semiconductor chip 100 may be combined with the second semiconductor chip 200 so that a lower surface of the first wiring layer 140 of the first semiconductor chip 100 faces an upper surface of the second wiring layer 210 of the second semiconductor chip 200. In addition, the plurality of through vias 130 may be formed in the plurality of through via regions of the first and second peripheral regions PE1 and PE2, and the first semiconductor chip 100 and the second semiconductor chip 200 may be electrically connected to each other through the plurality of through vias 130. Therefore, the pixel signals from the pixel region PA of the first semiconductor chip 100 may be transmitted to the logic elements of the logic region LA of the second semiconductor chip 200. In addition, driving signals and power/ground signals may be transmitted from the logic elements of the logic region LA of the second semiconductor chip 200 to the pixels of the pixel region PA of the first semiconductor chip 100.

Describing the structure of the pixel region PA in more detail with reference to FIGS. 2A and 2B, the pixel region PA may include an active pixel region PAa and a dummy pixel region PAd. A plurality of active pixels PXa may be arranged in the active pixel region PAa in the two-dimensional array structure, and a plurality of dummy pixels PXd may be arranged in the dummy pixel region PAd in the two-dimensional array structure. The plurality of active pixels PXa of the active pixel region PAa and the plurality of dummy pixels PXd of the dummy pixel region PAd may be isolated and/or insulated from each other by a plurality of deep trench isolations (DTI) 120. As noted from FIG. 2A, the plurality of DTIs 120 may be two-dimensional grids corresponding to the two-dimensional array structures of the plurality of active and dummy pixels PXa and PXd in a plan view.

The plurality of DTIs 120 may pass through the first semiconductor substrate 101 in the third direction (e.g., the z direction). Because the plurality of DTIs 120 pass through the first semiconductor substrate 101, it is possible to prevent crosstalk from being caused by light incident at an angle. In addition, a plurality of photodiodes PD of the plurality of active pixels Ma may be adjacent to the plurality of DTIs 120. Therefore, a light receiving area increases so that a fill factor may increase.

Each of the plurality of DTIs 120 may include a conductive layer 122 and an insulating layer 124. The conductive layer 122 may include, for example, polysilicon or polysilicon doped with impurities. However, a material of the conductive layer 122 is not limited thereto. For example, the conductive layer 122 may include a metal, metal silicide, or a metal containing conductive material. The insulating layer 124 may at least partially surround an outside of the conductive layer 122 and may insulate the conductive layer 122 from the first semiconductor substrate 101. The insulating layer 124 may include, for example, oxide or nitride such as silicon oxide, silicon nitride, or silicon oxynitride. However, a material of the insulating layer 124 is not limited thereto.

A backside contact 110 for applying power, for example, a (−) voltage to the conductive layer 122 of each of the plurality of DTIs 120 may be arranged in each of the plurality of dummy pixel regions PAd. For reference, the backside contact 110 may be formed on a backside of the first semiconductor substrate 101. For example, the backside contact 110 may be formed adjacent to a side of the first semiconductor substrate 101. In addition, because the (−) voltage is applied to the conductive layer 122 of each of the plurality of DTIs 120 through the backside contact 110, holes that may exist on a surface of the insulating layer 124 of each of the plurality of DTIs 120 may be fixed and dark current characteristics may be reduced. For example, when the (−) voltage is applied to the conductive layer 122, electrons of the conductive layer 122 may move to an interface of the insulating layer 124 and holes in the first semiconductor substrate 101 may move to the interface of the insulating layer 124 and may be accumulated. As described above, the holes are accumulated on the interface of the insulating layer 124 of each of the plurality of DTIs 120 and are fixed so that a defect of electrons caused by the insulating layer 124 of each of the plurality of DTIs 120 may be suppressed and the dark current characteristics of the image sensor may be reduced.

The backside contact 110 may have a shape similar to that of each of the plurality of dummy pixels PXd. For example, the backside contact 110 may be in the form of a square pillar having a square horizontal cross-section and passing through the first semiconductor substrate 101. The backside contact 110 may include a conductive layer such as a metal. For example, the backside contact 110 may include tungsten (W). However, a material of the backside contact 110 is not limited thereto.

In the image sensor 1000 according to the current embodiment, the backside contact 110 may contact the conductive layer 122 of each of the plurality of DTIs 120 through four sides of the square pillar shape of the backside contact 110. In FIGS. 2A and 2B, a portion in which the backside contact 110 contacts the conductive layer 122 of each of the plurality of DTIs 120 is marked with small hatches. As described above, because the backside contact 110 contacts the conductive layer 122 through the four sides of the square pillar shape, a contact area between the backside contact 110 and the conductive layer 122 may be increased. Therefore, contact resistance may be minimized and a voltage may be effectively applied.

For reference, a structure in which the backside contact 110 contacts the conductive layer 122 of each of the plurality of DTIs 120 in the upper portion of the first semiconductor substrate 101 may be considered. In such a structure, the contact area between the backside contact 110 and the conductive layer 122 may be limited to an area of a horizontal cross-section of the conductive layer 122. Recently, as the number of pixels increases, voltage application characteristics may be affected by resistance and contact resistance of the conductive layer 122 including polysilicon. To reduce the resistance and contact resistance of the conductive layer 122 including polysilicon, polysilicon is doped. However, in the structure in which the backside contact 110 contacts the conductive layer 122 of each of the plurality of DTIs 120 in the upper portion of the first semiconductor substrate 101, due to limitations on the contact area, there may be limitations on improving the voltage application characteristics. However, in the image sensor 1000 according to the current embodiment, because a side of the backside contact 110 contacts the conductive layer 122 of each of the plurality of DTIs 120, the contact area may be increased so that the contact resistance may be minimized and the voltage application characteristics may be improved.

In the image sensor 1000 according to the current embodiment, the backside contact 110 may be formed together with the plurality of through vias 130. For example, the backside contact 110 and the plurality of through vias 130 may be simultaneously formed through one process. Therefore, in the image sensor 1000 according to the current embodiment, because an additional process of forming the backside contact 110 may be omitted, manufacturing cost of the image sensor 1000 may be reduced.

With reference to FIGS. 2A and 2B, the plurality of through vias 130 may be arranged in the row and column through via regions VCx, VCy1, and VCy2 of the first peripheral region PE1. For example, the through via 130 may be arranged in the first column through via region VCy1. The through via 130 may be formed by forming a first hole H1 passing through the first semiconductor substrate 101, the first wiring layer 140, and part of the second wiring layer 210 and by filling the first hole H1 with a metal, for example, W to a predetermined thickness. In addition, wiring lines may be arranged in the first wiring layer 140 and the second wiring layer 210 and the wiring lines may function as etch stoppers in an etching process for forming the first through hole H1. For example, a first wiring line 142p that is the uppermost wiring line among the wiring lines of the first wiring layer 140 may function as the etch stopper, and a second wiring line 212p among the wiring lines of the second wiring layer 210 may function as the etch stopper. In addition, based on a position and structure of the first wiring line 142p, the first through hole H1 may have a relatively large width to the first wiring line 142p and may have a relatively small width from the first wiring line 142p to the second wiring line 212p. For example, the width of the first hole H1 from the upper surface of the first semiconductor chip 100 to the first wiring line 142p may be larger than the width of the first hole H1 from the first wiring line 142p to the second wiring line 212p.

In addition, the first wiring line 142p and the second wiring line 212p may correspond to power supply wiring lines, for example, (−) voltage supply wiring lines and may contact the through via 130. Therefore, power, for example, the (−) voltage from the second semiconductor chip 200 may be applied to the pixels of the pixel region PA of the first semiconductor chip 100 through the second wiring line 212p, the through via 130, and the first wiring line 142p. In addition, the (−) voltage from the second semiconductor chip 200 may be applied to the conductive layer 122 of each of the plurality of DTIs 120 of the first semiconductor chip 100 through the second wiring line 212p, the through via 130, and the backside contact 110.

Because the backside contact 110 passes through the first semiconductor substrate 101, when the through via 130 is formed in the first peripheral region PE1, the backside contact 110 may be simultaneously formed in the dummy pixel region PAd together with the through via 130. For example, the backside contact 110 may be formed by forming a second hole H2 passing through the first semiconductor substrate 101 and part of the first wiring layer 140 and by completely filling the second hole H2 with a metal, for example, W. In addition, wiring lines may be arranged in the first wiring layer 140 of the dummy pixel region Pad, and the wiring lines may function as etch stoppers in an etching process for forming the second through hole H2. For example, a first wiring line 142d that is the uppermost wiring line among the wiring lines of the first wiring layer 140 of the dummy pixel region PAd may function as the etch stopper. The first wiring line 142d may contact the backside contact 110. In addition, the first wiring line 142d may be connected to the plurality of active pixels PXa of the active pixel region PAa and may operate as a (−) voltage supply wiring line. However, according to an exemplary embodiment of the present inventive concept, the first wiring line 142d may not be connected to the plurality of active pixels PXa of the active pixel region PAa and may only operate as the etch stopper.

For reference, when the backside contact 110 contacts the conductive layer 122 of each of the plurality of DTIs 120 in the upper portion of the first semiconductor substrate 101, because the backside contact 110 has a relatively small depth, the backside contact 110 may not be formed together with the through via 130. For example, with respect to the upper surface of the first semiconductor chip 100, the through via 130 may have a depth greater than that of the backside contact 110. Therefore, a trench forming process and a metal gapfill process of filling a trench for the backside contact 110 must be separately performed from a through hole thrilling process and a metal gapfill process of filling the through hole for the through via. As a result, because the process of forming the backside contact 110 must be additionally performed, process difficulty and the manufacturing cost of the image sensor may increase. In addition, in the image sensor 1000 according to the current embodiment, because the backside contact 110 is simultaneously formed together with the through via 130 by one process, the process difficulty and the manufacturing cost of the image sensor 1000 may be reduced.

In addition, a horizontal cross-section of the first through hole H1 may be greater than that of the second through hole H2. For example, a first width W1 of the first through hole H1 in the first direction (e.g., the x direction) may be greater than a second width W2 of the second through hole H2 in the first direction (e.g., the x direction). For example, the first width W1 may be about several μm at and the second width W2 may be less than about 1 μm. For example, the first width W1 may be greater than about 1 μm. However, the first width W1 and the second width W2 are not limited to the above numerical values. For example, the through hole may have a tapered shape. For example, when the through hole is tapered so that an upper portion thereof is wide and a lower portion thereof is narrow, the width of the through hole may be defined as an intermediate width or an average width.

In the image sensor 1000 according to the current embodiment, because the first through hole H1 is wider than the second through hole H2 and the through via 130 and the backside contact 110 are simultaneously formed, a shape of the through via 130 may be different from that of the backside contact 110. For example, the through via 130 may include a lower metal layer formed by completely filling a lower portion of the first through hole H1 with a metal, for example, W and an upper metal layer formed of W on an intermediate bottom surface and a side of the first through hole H1 to a predetermined thickness. For example, the intermediate bottom surface may be disposed on the first wiring line 142p. In addition, a space may be maintained in the center of the first through hole H1 corresponding to the upper metal layer. In addition, regarding the backside contact 110, the second through hole H2 may be completely filled, and the backside contact 110 might not include a space in the center thereof. For reference, the space of the first through hole H1 may be filled with a protective layer such as solder resist PR before as color filter is formed later.

In addition, as illustrated in FIG. 2B, the through via 130 and the backside contact 110 may extend into an upper surface of the first semiconductor substrate 101 and may be connected to each other. Therefore, as described above, the (−) voltage from the second semiconductor chip 200 may be applied to the conductive layer 122 of each of the DTIs 120 through the second wiring line 212p, the through via 130, and the backside contact 110. Furthermore, the through via 130 and the backside contact 110 may extend on an interlayer insulating layer 150 and penetrate the upper surface of the first semiconductor substrate 101. Here, the interlayer insulating layer 150 may be, for example, an oxide-based transparent insulating layer. For example, the interlayer insulating layer 150 may be a single layer or a multilayer. For example, the interlayer insulating layer 150 may include an anti-reflection layer, a lower insulating layer under the anti-reflection layer, and an upper insulating layer on the anti-reflection layer. In addition, the through via 130 and the backside contact 110 may extend to a certain portion on the interlayer insulating layer 150. For example, the through via 130 may not be connected to another through via 130 that is not adjacent thereto. However, in the case of the backside contact 110, according to an embodiment of the present inventive concept, backside contacts 110 adjacent to each other may be connected to each other.

In addition, the backside contact 110 may have a square pillar shape. However, the shape of the backside contact 110 is not limited thereto. For example, according to an exemplary embodiment of the present inventive concept, the backside contact 110 may be in the form of a cylinder, an elliptical pillar, or a polygonal pillar other than the square pillar. For example, the backside contact 110 may include at least one flat side contacting the conductive layer 122 of each of the DTIs 120. For example, although the backside contact 110 may be entirely in the form of the cylinder or the elliptical pillar, a flat plane may exist in one side, and the flat plane contacts the conductive layer 122 of each of the DTIs 120. However, the present inventive concept is not limited thereto. For example, the backside contact 110 may include a rounded side contacting the conductive layer 122.

Furthermore, the image sensor 1000 according to the current embodiment may be used for, for example, a fingerprint sensor, an iris sensor, or a vision sensor as well as a camera or an optical inspection device including an image sensor. Furthermore, present inventive concept of the image sensor 1000 according to the current embodiment may also be used for a semiconductor device in the form of a package to which a (−) bias voltage is applied as well as an image sensor field.

In the image sensor 1000 according to the current embodiment, the backside contact 110 in the form of the square pillar may be arranged in the dummy pixel region PAd and may contact the conductive layer 122 of each of the DTIs 120 through four sides of the square pillar. Therefore, the contact area between the backside contact 110 and the conductive layer 122 is increased so that the contact resistance may be minimized and the voltage application characteristics may be improved. In addition, in the image sensor 1000 according to the current embodiment, the backside contact 110 may be simultaneously formed together with the through via 130 by one process. Therefore, in the image sensor 1000 according to the current embodiment, because the additional process of forming the backside contact 110 may be omitted, the manufacturing cost of the image sensor 1000 may be reduced.

Figure 3A:
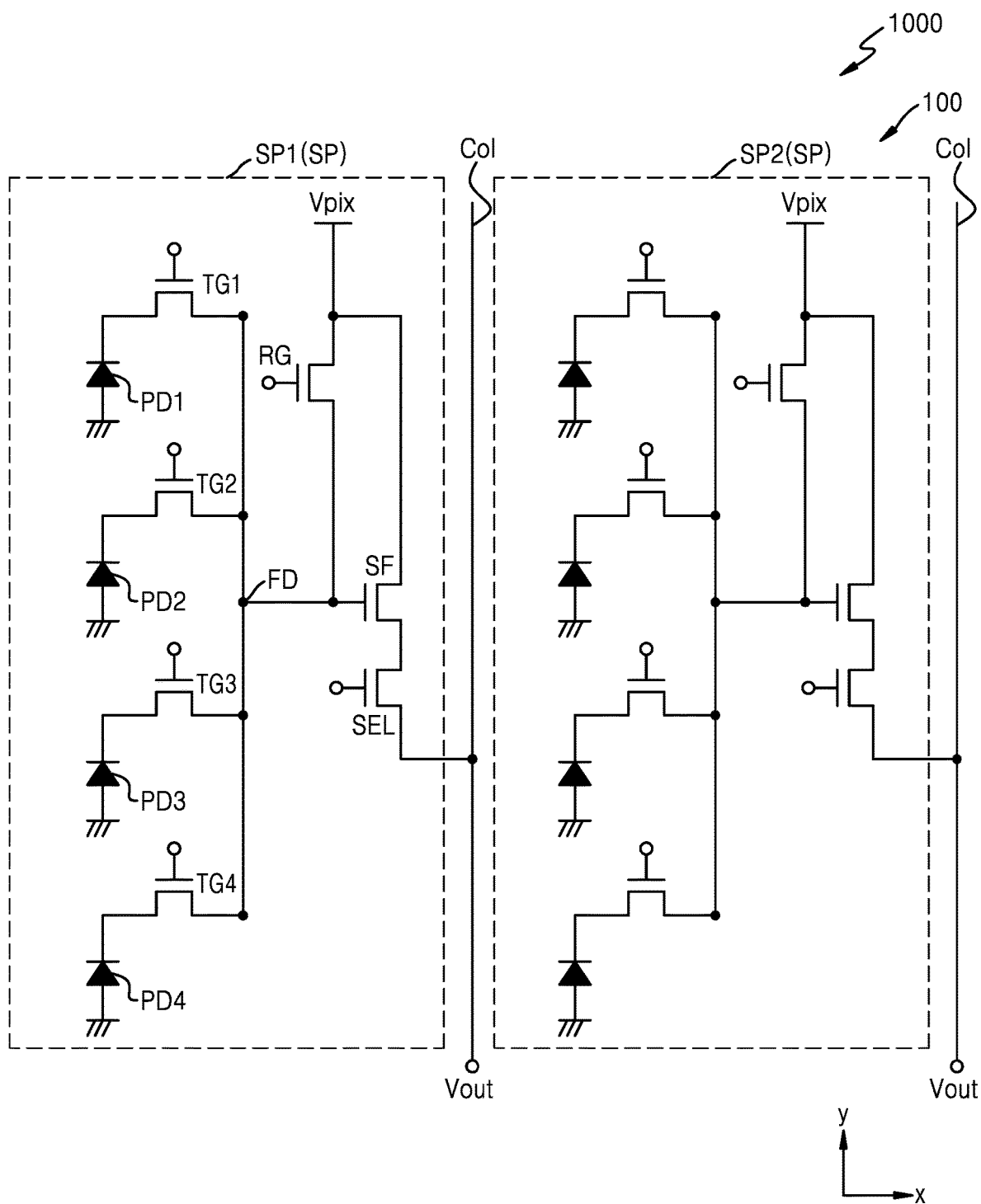
FIGS. 3A and 3B are, respectively, a circuit diagram illustrating a unit pixel of pixels included in a pixel region of a first semiconductor chip in the image sensor of FIG. 1 and a schematic plan view corresponding thereto.
Figure 3B:
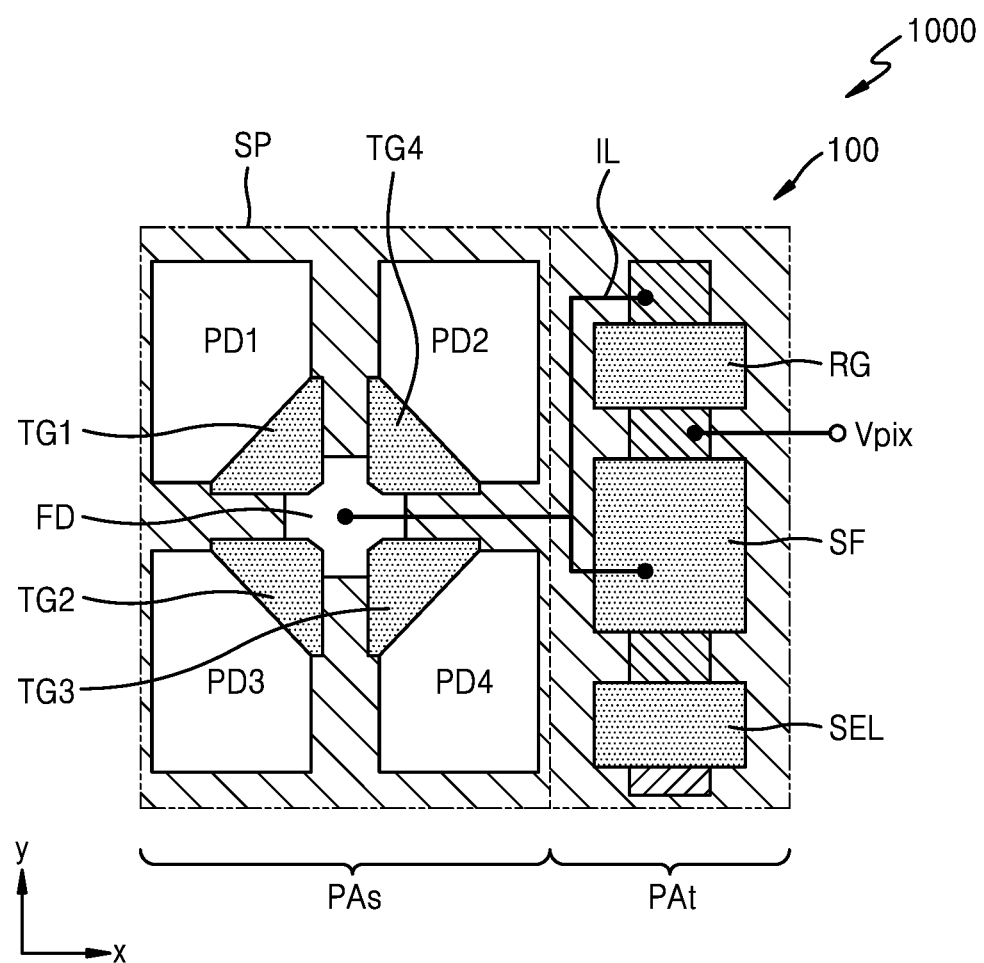

FIGS. 3A and 3B are a circuit diagram illustrating a unit pixel configuring pixels included in a pixel region of a first semiconductor chip 100 in the image sensor 1000 of FIG. 1 and a schematic plan view corresponding thereto. Description will be given with reference to FIG. 1 together and description previously given with reference to FIGS. 1 to 2B will be simply given or will not be given when there is a redundant description.

Referring to FIGS. 3A and 3B, in the image sensor 1000 according to the current embodiment, a plurality of shared pixels SP may be arranged in the active pixel region PAa of the first semiconductor chip 100 in the two-dimensional array structure. In FIG. 3A, two shared pixels SP1 and SP2 are illustrated. However, in the active pixel region PAa of the first semiconductor chip 100, the plurality of shared pixels SP may be arranged in the first direction (e.g., the x direction) and the second direction (e.g., the y direction), and in the two-dimensional array structure.

Each of the plurality of shared pixels SP may include a pixel shared region PAs and a transistor (TR) region PAt. For example, a photodiode PD, a transmission TR TG, and a floating diffusion region FD may be arranged in the pixel shared region PAs, and a reset TR RG, a source follower TR SF, and a selection TR SEL may be arranged in the TR region PAt.

The photodiode PD as a P-N junction diode may generate charges, for example, electrons that are negative charges and holes that are positive charges in proportion to an amount of incident light. The transmission TR TG may transmit the charges generated by the photodiode PD to the floating diffusion region FD, and the reset TR RG may periodically reset the charges stored in the floating diffusion region FD. In addition, the source follower TR SF, as a buffer amplifier, may buffer a signal in accordance with the charges charged in the floating diffusion region FD, and the selection TR SEL, as a TR functioning as a switch, may select a corresponding pixel. In addition, a column line Col may be connected to a source region of the selection TR SEL, and a voltage of the source region of the selection TR SEL may be output through the column line Col as an output voltage Vout. In the image sensor 1000 according to the current embodiment, one photodiode PD corresponds to one pixel. Therefore, hereinafter, unless specifically mentioned, the photodiode PD and the pixel are treated as the same concept.

As illustrated in FIG. 3B, one pixel shared region PAs includes first to fourth photodiodes PD arranged therein. Therefore, one shared pixel SP may include four pixels, for example, four active pixels PXa. For example, in the shared pixel SP, the first to fourth photodiodes PD1 to PD4 may share one floating diffusion region FD while being arranged around the floating diffusion region FD.

In the shared pixel SP, the first to fourth photodiodes PD1 to PD4 may share the floating diffusion region FD through first to fourth transmission TRs TG1 to TG4 respectively corresponding to the first to fourth photodiodes PD1 to PD4 as noted from the circuit diagram of FIG. 3A. For example, the first transmission TR TG1 corresponding to the first photodiode PD1, the second transmission TR TG2 corresponding to the second photodiode PD2, the third transmission TR TG3 corresponding to the third photodiode PD3, and the fourth transmission TR TG4 corresponding to the fourth photodiode PD4 may share the floating diffusion region FD as a common drain region.

In addition, in the shared pixel SP, the first to fourth photodiodes PD1 to PD4 may share the reset TR RG, the source follower TR SF, and the selection TR SEL excluding the first to fourth transmission TRs TG1 to TG4. For example, the first to fourth photodiodes PD1 to PD4 configuring the shared pixel SP may share the reset TR RG, the source follower TR SF, and the selection TR SEL. The reset TR RG, the source follower TR SF, and the selection TR SEL may be arranged in the second direction (e.g., the y direction) in the TR region PAt. However, in accordance with an arrangement structure of the first to fourth photodiodes PD1 to PD4 and the first to fourth transmission TRs TG1 to TG4 in the pixel shared region PAs, the reset TR RG, the source follower TR SF, and the selection TR SEL may be arranged in the first direction (e.g., the x direction) in the TR region PAt.

When a connection relationship among the first to fourth transmission TRs TG1 to TG4, the reset TR RG, the source follower TR SF, and the selection TR SEL is simply described with reference to the circuit diagram of FIG. 3A, the first to fourth photodiodes PD1 to PD4 may respectively configure source regions of the first to fourth transmission TRs TG1 to TG4. The floating diffusion region FD may configure the common drain region of the first to fourth transmission TRs TG1 to TG4 and may be connected to the source region of the reset TR RG by a wiring line IL. In addition, the floating diffusion region FD may also be connected to a gate electrode of the source follower TR SF through the wiring line IL. A drain region of the reset TR RG and a drain region of the source follower TR SF may be shared and may be connected to a power voltage Vpix. A source region of the source follower TR SF and a drain region of the selection TR SEL may be shared. For example, a source region of the source follower TR SF may be connected to a drain region of the selection TR SEL. The output voltage Vout may be connected to the source region of the selection TR SEL. For example, a voltage of the source region of the selection TR SEL may be output through the column line Col as the output voltage Vout.

In the image sensor 1000 according to the current embodiment, the shared pixel SP may include four pixels of the pixel shared region PAs and the reset TR RG, the source follower TR SF, and the selection TR SEL of the TR region PAt corresponding to the pixel shared region Pas. In addition, the first to fourth transmission TRs TG1 to TG4 corresponding to the shared first to fourth photodiodes PD1 to PD4 may be arranged in the pixel shared region PAs. In addition, it is described that one shared pixel SP includes four pixels. However, a shared pixel structure of the image sensor 1000 according to the current embodiment is not limited thereto. For example, in the image sensor 1000 according to the current embodiment, one shared pixel may include two or eight pixels. In addition, according to an exemplary embodiment of the present inventive concept, single pixels that are not shared pixels may be arranged in the active pixel region PAa. Each of the single pixels may include a photodiode PD, a floating diffusion region FD, transmission TR, a reset TR RG, a source follower TR SF, and a selection TR SEL.

FIGS. 4A to 4E are plan views illustrating image sensors 1000a to 1000d each having a stack structure according to exemplary embodiments of the present inventive concept and only portions corresponding to and different from those of FIG. 2A are illustrated. Description previously given with reference to FIGS. 1 to 3B will be simply given or will not be given when the description is redundant.

Figure 4A:
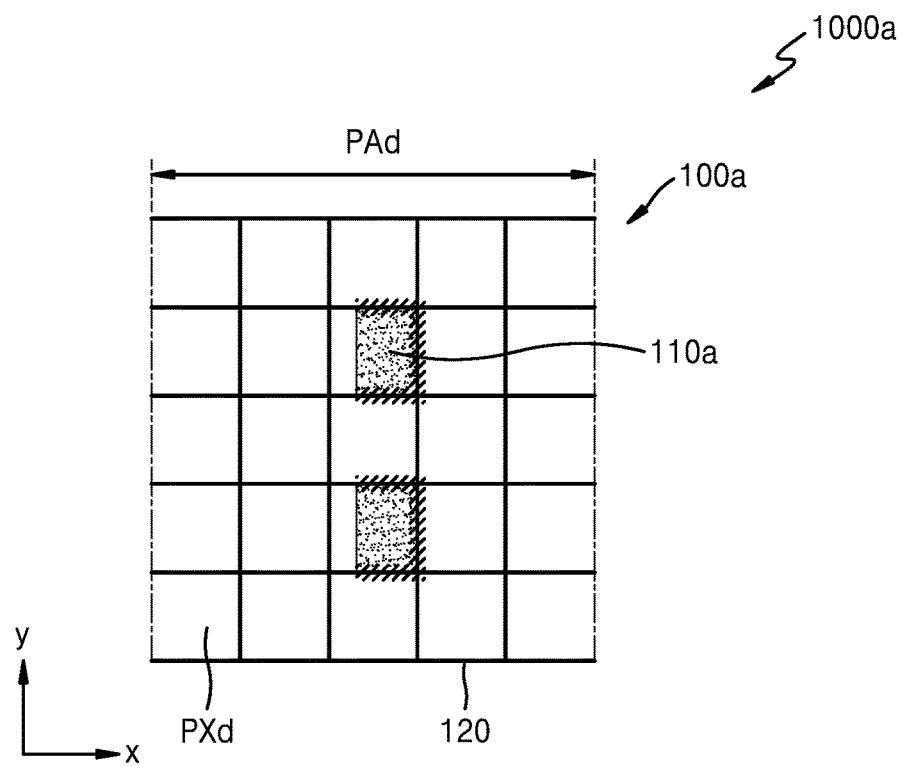
FIGS. 4A, 4B, 4C, 4D, and 4E are plan views illustrating image sensors each having a stack structure according to an exemplary embodiment of the present inventive concept.

Referring to FIG. 4A, the image sensor 1000a according to the current embodiment may be different from the image sensor 1000 of FIG. 2A with regard to a structure of a backside contact 110a of a first semiconductor chip 100a. For example, in the image sensor 1000a according to the current embodiment, the backside contact 110a may be in the form of a square pillar shape and a horizontal cross-sectional area of the backside contact 110a may be less than that of a dummy pixel PXd. For example, the horizontal cross-sectional area of the backside contact 110a may be about ⅔ of that of the dummy pixel PXd. In addition, in the backside contact 110a, parts of sides of the square pillar may contact the conductive layer (122 of FIG. 2B) of each of the plurality of DTIs 120. For example, the conductive layer 122 of each of the plurality of DTIs 120 surrounding one dummy pixel PXd has four sides and, as marked with hatches in FIG. 4A, one of the four sides of the square pillar of the backside contact 110a may completely contact one side of the conductive layer 122 of each of the plurality of DTIs 120 and each of two of the four sides of the square pillar of the backside contact 110a may respectively contact about ⅔ of the corresponding side of the conductive layer 122 of each of the plurality of DTIs 120. In addition, the remaining one side of the four sides of the square pillar of the backside contact 110a might not contact the conductive layer 122 of each of the plurality of DTIs 120.

In the image sensor 1000a according to the current embodiment, the backside contact 110a is in the form of the square pillar, and three sides of the backside contact 110a contact the conductive layer 122 of each of the plurality of DTIs 120. In addition, the horizontal cross-sectional area of the backside contact 110a is about ⅔ of that of the dummy pixel PXd. However, the contact type and the horizontal cross-sectional area of the backside contact 110a are not limited thereto. For example, the backside contact 110a may have one of various contact types and horizontal cross-sectional areas in each of the plurality of DTIs 120 surrounding one dummy pixel PXd. For example, three sides of the backside contact 110a may contact the conductive layer 122 of each of the plurality of DTIs 120, and the horizontal cross-sectional area of the backside contact 110a may have one of various sizes such as ⅔, ⅓, and ¼ of the horizontal cross-sectional area of the dummy pixel PXd. In another example, two sides of the backside contact 110a may contact the conductive layer 122 of each of the plurality of DTIs 120, and the backside contact 110a may have one of various horizontal cross-sectional areas. Here, the two sides may face each other or may be adjacent to each other. In addition, one side of the backside contact 110a may contact the conductive layer 122 of each of the plurality of DTIs 120, and the backside contact 110a may have one of various horizontal cross-sectional areas.

Figure 4B:
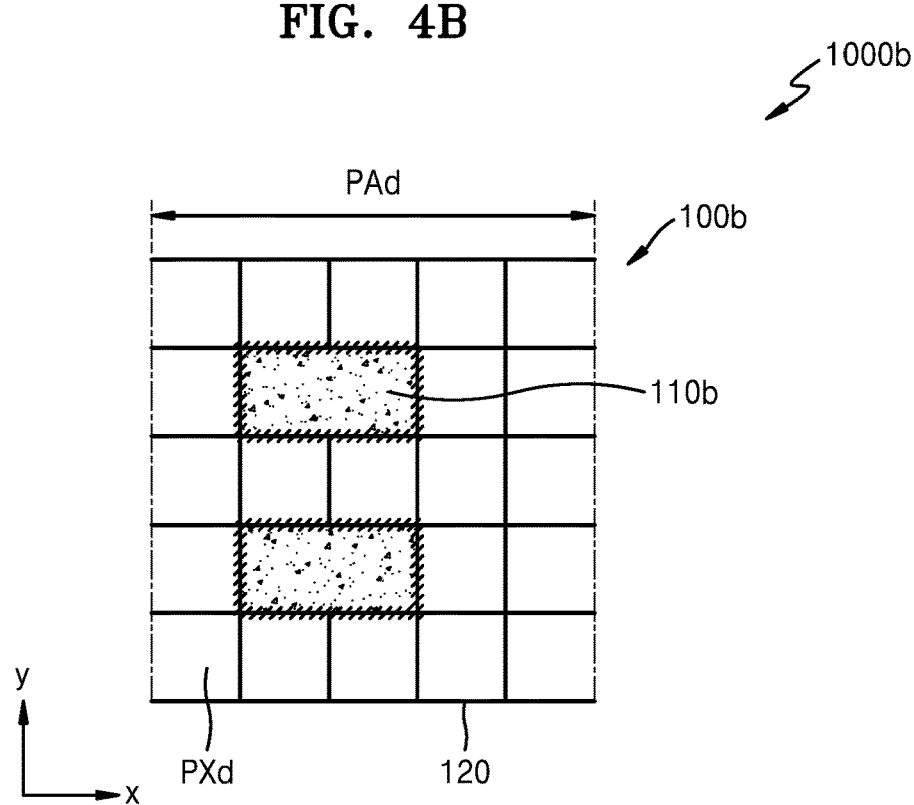

Referring to FIG. 4B, the image sensor 1000b according to the current embodiment may be different from the image sensor 1000 of FIG. 2A with regard to a structure of a backside contact 110b of a first semiconductor chip 100b. For example, in the image sensor 1000b according to the current embodiment, the backside contact 110b may be in the form of a square pillar, in which all sides of the square pillar may contact the conductive layer 122 of each of the plurality of DTIs 120, and a horizontal cross-sectional area of the backside contact 110b may be greater than that of a dummy pixel PXd. For example, the horizontal cross-sectional area of the backside contact 110b may be substantially equal to that of two dummy pixels PXd adjacent to each other in the first direction (e.g., the x direction). For example, the conductive layer 122 of each of the plurality of DTIs 120 surrounding an outside of the two dummy pixels PXd adjacent to each other in the first direction (e.g., the x direction) has four sides, and, as marked with hatches in FIG. 4B, the four sides of the square pillar of the backside contact 110b may contact the four sides of the conductive layer 122 of each of the plurality of DTIs 120. For example, the four sides of the square pillar of the back side contact 110b may completely contact the four sides of the conductive layer 122 of each of the plurality of DTIs 120. For reference, in the image sensor 1000b according to the current embodiment, because the backside contact 110b is formed by removing the two dummy pixels PXd adjacent to each other in the first direction (e.g., the x direction), the DTI 120 surrounding the outside of the two dummy pixels PXd may exist and the DTI 120 between the two dummy pixels PXd may not exist.

In the image sensor 1000b according to the current embodiment, the backside contact 110b is in the form of the square pillar shape, and all the four sides of the backside contact 110b contact the conductive layer 122 of each of the plurality of DTIs 120. In addition, the horizontal cross-sectional area of the backside contact 110b is substantially equal to that of the two dummy pixels PXd adjacent to each other in the first direction (e.g., the x direction). However, the horizontal cross-sectional area of the backside contact 110b is not limited thereto. For example, when the backside contact 110b may be in the form of the square pillar shape, all the four sides of the backside contact 110b may contact the conductive layer 122 of each of the plurality of DTIs 120, and the horizontal cross-sectional area of the backside contact 110b may not be less than the horizontal cross-sectional area of three dummy pixels PXd adjacent to one another in the first direction (e.g., the x direction).

Figure 4C:
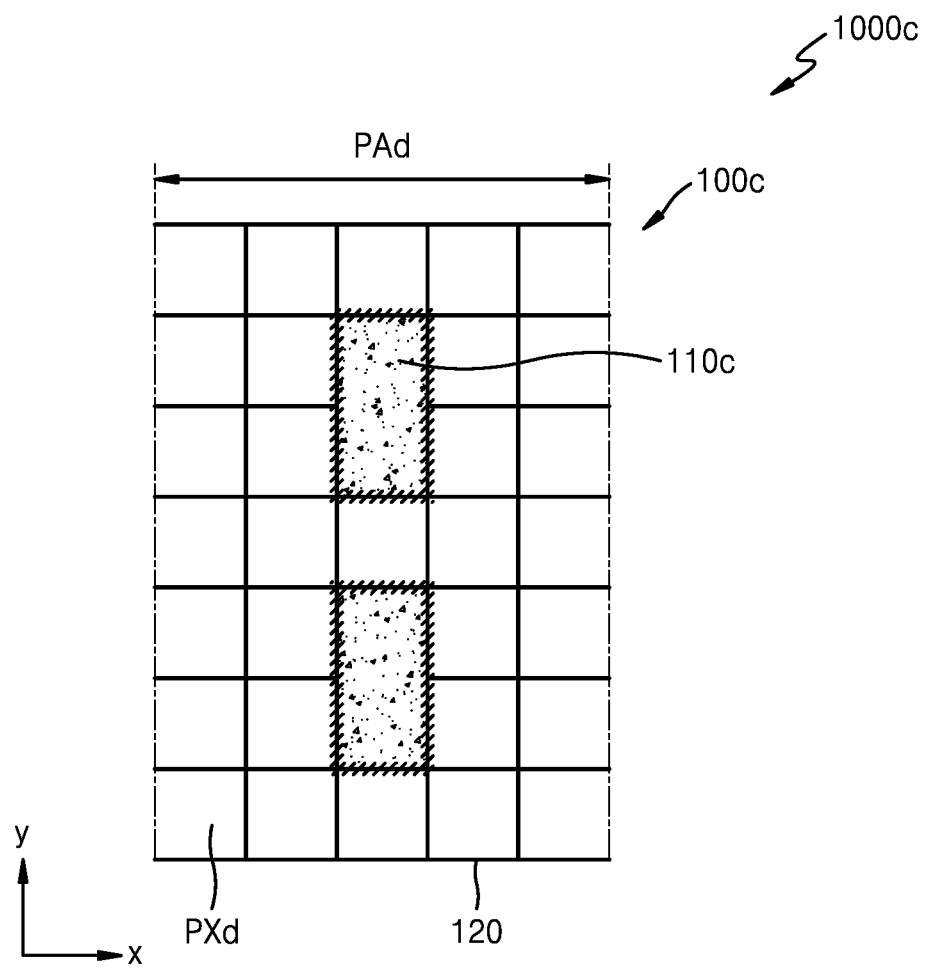

Referring to FIG. 4C, the image sensor 1000c according to the current embodiment may be different from the image sensor 1000b of FIG. 2B with regard to a structure of a backside contact 110c of a first semiconductor chip 100c. For example, in the image sensor 1000c according to the current embodiment, the backside contact 110c may be in the form of a square pillar, and all sides of the square pillar may contact the conductive layer 122 of each of the plurality of DTIs 120. In addition, a horizontal cross-sectional area of the backside contact 110c may be substantially equal to that of two dummy pixels PXd adjacent to each other in the second direction (e.g., the y direction). However, in the image sensor 1000c according to the current embodiment, the horizontal cross-sectional area of the backside contact 110c is not limited to that of the two dummy pixels PXd adjacent to each other in the second direction (e.g., the y direction) and may be substantially equal to or greater than that of three dummy pixels PXd adjacent to one another in the second direction (e.g., the y direction).

In FIGS. 4B and 4C, it is illustrated that the backside contact 110b of FIG. 4B and 110c of FIG. 4C is in the form of the square pillar shape, and all the four sides of the square pillar shape contact the conductive layer 122 of each of the DTIs 120. In addition, the horizontal cross-sectional area of the backside contact 110b of FIG. 4B and 110c of FIG. 4C is substantially equal to an integer multiple of the horizontal cross-sectional area of the dummy pixel PXd. However, the contact type and the horizontal cross-sectional area of the backside contact 110b of FIG. 4B and 110c of FIG. 4C are not limited thereto. For example, one side, two sides, or three sides of the backside contact 110b of FIG. 4B and 110c of FIG. 4C may contact the conductive layer 122 of each of the DTIs 120, and the horizontal cross-sectional area of the backside contact 110b of FIG. 4B and 110c of FIG. 4C may have various non-integer multiple sizes such as 1.5 times, 2.5 times, or 3.3 times the horizontal cross-sectional area of the dummy pixel PXd.

Figure 4D:
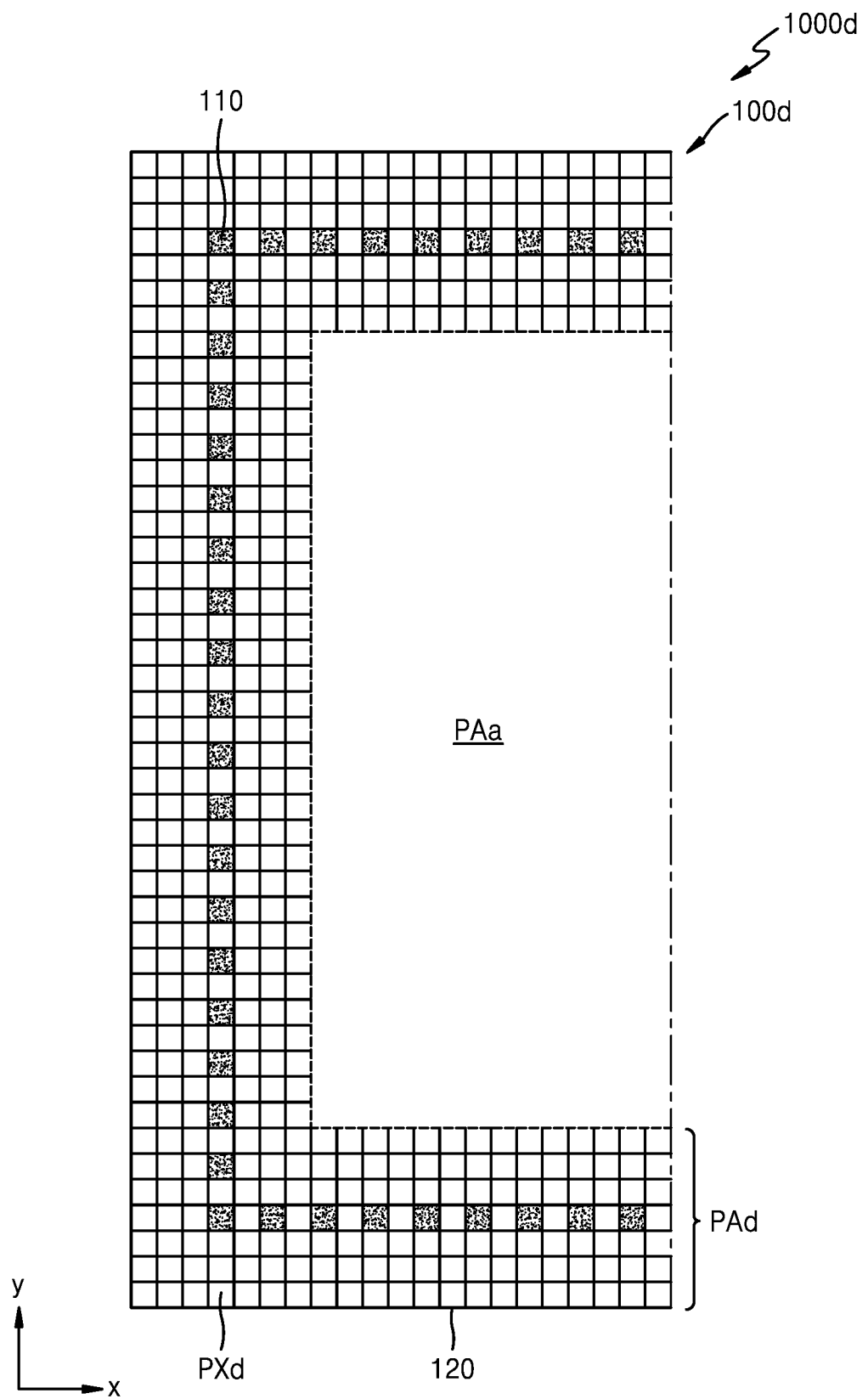

Referring to FIG. 4D, in an image sensor 1000d according to the current embodiment, a plurality of backside contacts 110 of a first semiconductor chip 100d may be arranged in a dummy pixel region PAd such that the backside contact 110 may be alternately disposed with one dummy pixel PXd to at least partially surround an active pixel region PAa. For example, the backside contact 110 may be alternately disposed with the dummy pixel PXd to surround the active pixel region PAa. In the image sensor 1000d according to the current embodiment, the backside contact 110 has the same shape as that of the backside contact 110 of FIG. 2A. However, the shape of the backside contact 110 is not limited thereto. For example, the backside contact 110 having one of various shapes, which is described with reference to FIGS. 4A to 4C, may surround the active pixel region PAa alternating with one dummy pixel PXd.

Figure 4E:
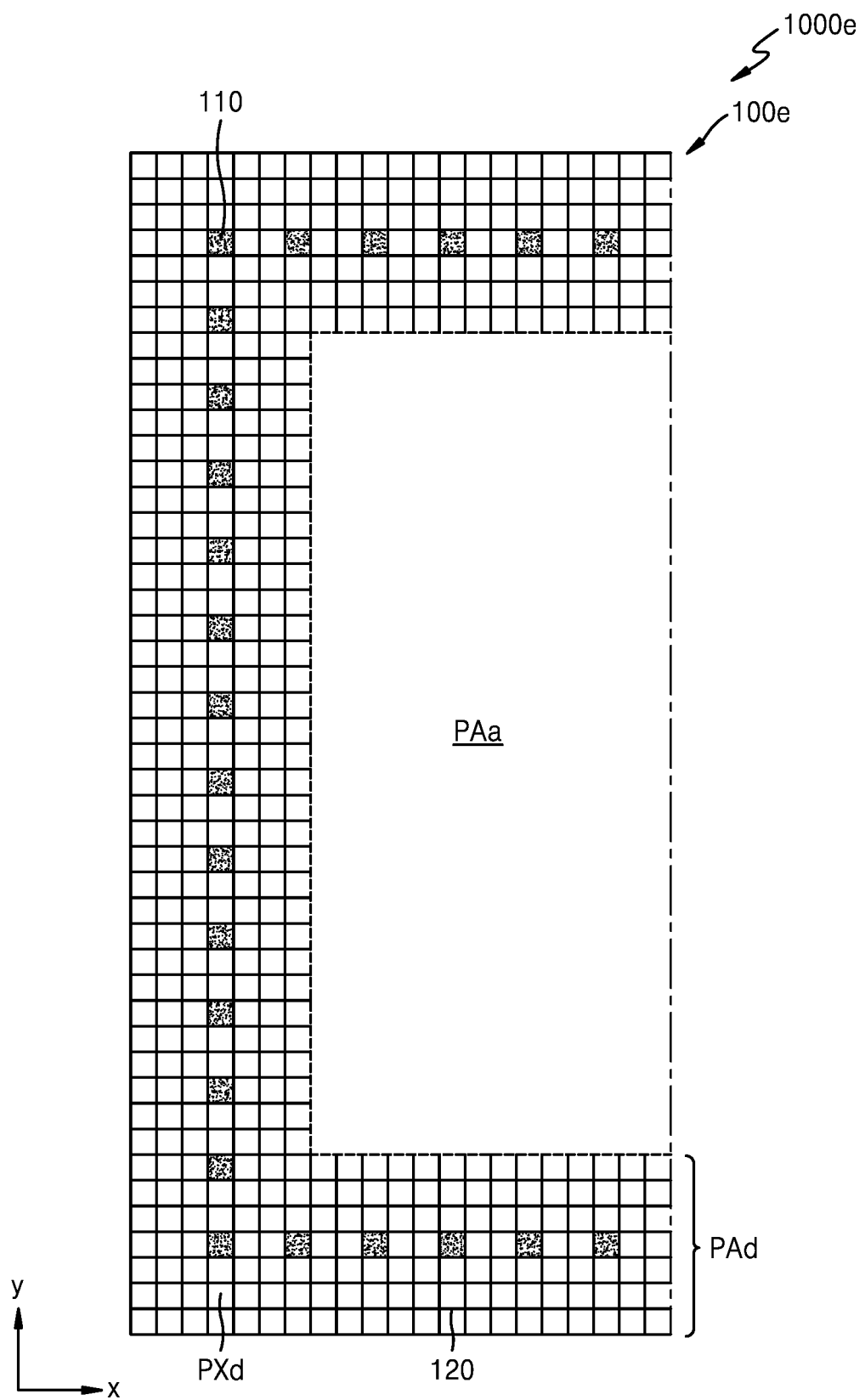

Referring to FIG. 4E, the image sensor 1000e according to the current embodiment may be different from the image sensor 1000d of FIG. 4D with regard to an arrangement structure of a backside contact 110 of a first semiconductor chip 100e. For example, in the image sensor 10000e according to the current embodiment, a plurality of backside contacts 110 may be arranged in a dummy pixel region PAd such that the backside contact 110 may be alternately disposed with two dummy pixels PXd, adjacent to each other, to at least partially surround an active pixel region PAa. In addition, in the image sensor 1000e according to the current embodiment, a shape of the backside contact 110 is not limited to that of the backside contact 110 of FIG. 2A, and the backside contact 110 may have one of various shapes described with reference to FIGS. 4A to 4C. In addition, in the image sensor 1000e according to an exemplary embodiment of the present inventive concept, the backside contact 110 may at least partially surround the active pixel region. PAa alternating with no less than three dummy pixels PXd.

FIGS. 5A to 5F are cross-sectional views illustrating image sensors 1000f to 1000k each having a stack structure according to exemplary embodiments of the present inventive concept. Description previously given with reference to FIGS. 1 to 3B will be simply given or will not be given when a description is redundant.

Figure 5A:
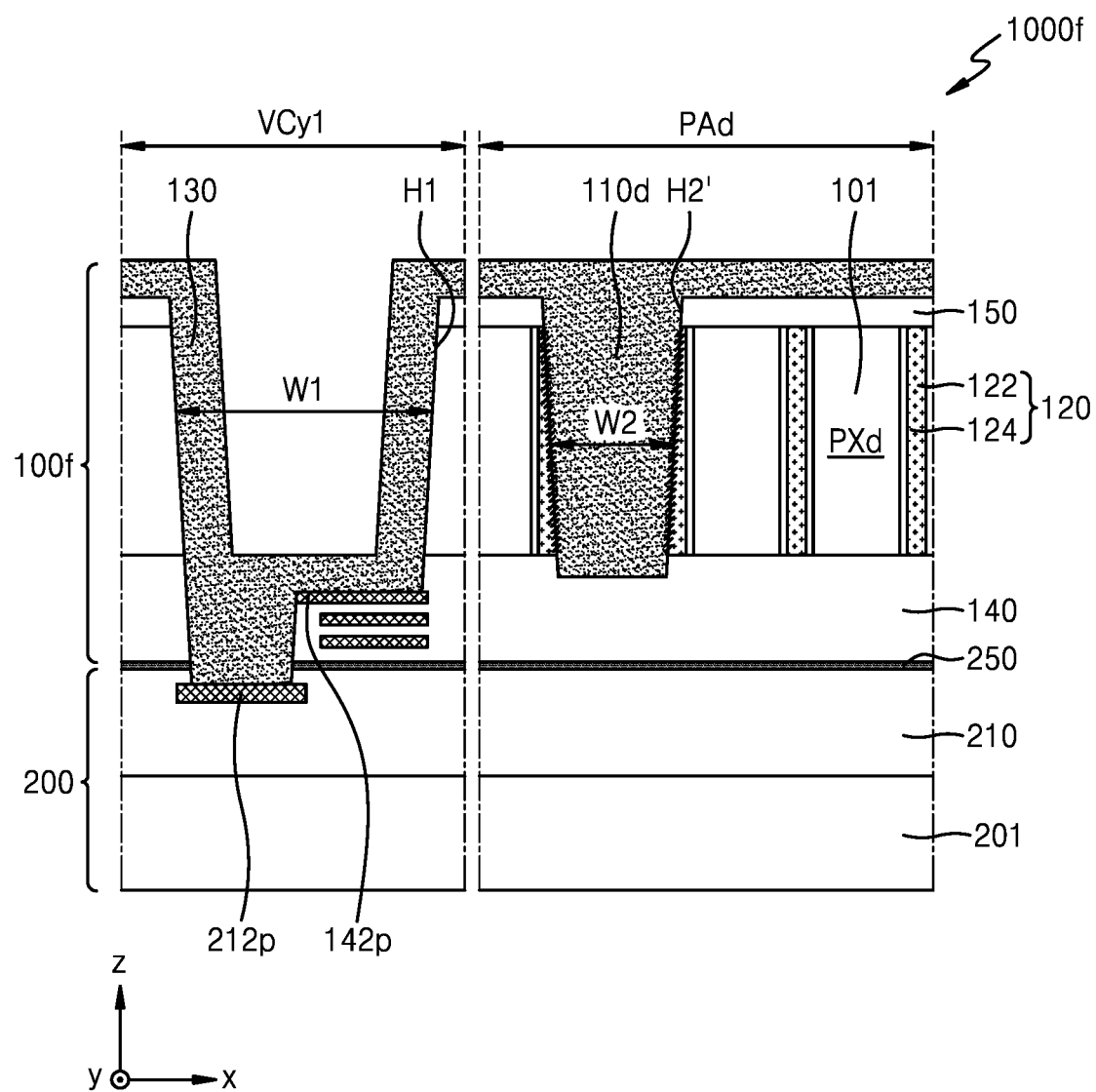
FIGS. 5A, 5B, 5C, 5D, 5E and 5F are cross-sectional views illustrating image sensors each having a stack structure according to an exemplary embodiment of the present inventive concept.

Referring to FIG. 5A, the image sensor 1000f according to an exemplary embodiment of the present inventive concept may be different from the image sensor 1000 of FIG. 2B with regard to a structure of a backside contact 110d of a first semiconductor chip 100f. For example, in the image sensor 1000f according to the current embodiment, wiring lines may not be arranged in a first wiring layer 140 corresponding to the backside contact 110d. Therefore, a lower surface of the backside contact 110d may not contact the wiring lines of the first wiring layer 140 and a lower surface of the first wiring layer 140 may be exposed to a first interlayer insulating layer. In addition, because the wiring lines do not exist in the first wiring layer 140 corresponding to the backside contact 110d, there is no layer functioning as an etch stopper in the first wiring layer 140 in the dummy pixel region PAd. Therefore, the backside contact 110d may be formed by a separate process from a through via 130. For example, a second through hole H2' and metal gapfill process for forming the backside contact 110d may be separately performed from a first through hole H1 and metal gapfill process for forming the through via 130.

In addition, in the image sensor 1000f according to an exemplary embodiment of the present inventive concept, the backside contact 110d may be in the form of a square pillar shape and at least one of four sides of the backside contact 110d may contact the conductive layer 122 of each of the plurality of DTIs 120. Therefore, a contact area in which the backside contact 110d contacts the conductive layer 122 of each of the plurality of DTIs 120 may be increased so that contact resistance may be minimized and voltage application characteristics may be improved.

Figure 5B:
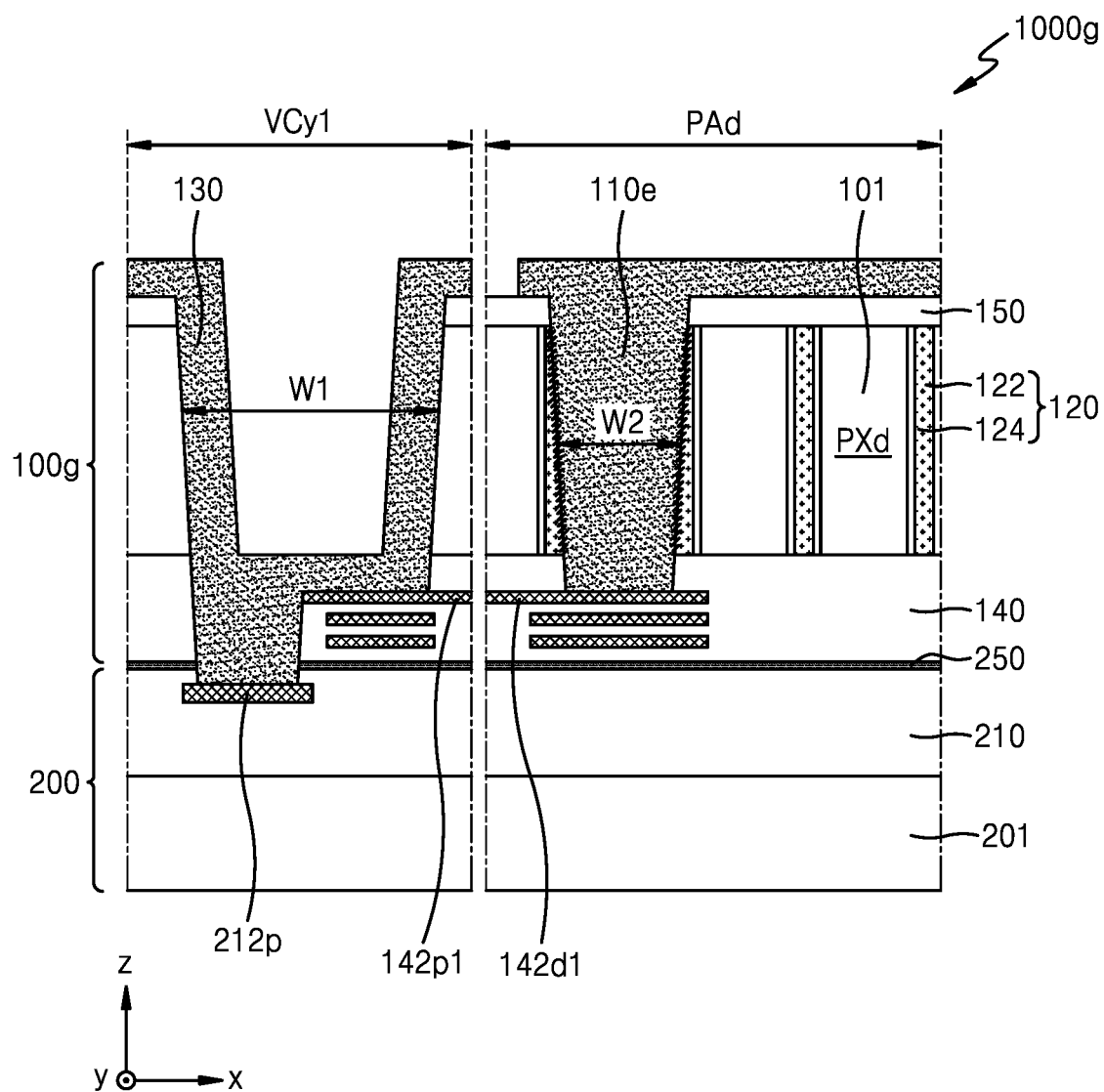

Referring to FIG. 5B, the image sensor 1000g according to an exemplary embodiment of the present inventive concept may be different from the image sensor 1000 of FIG. 2B with regard to structures of a backside contact 110e and a first wiring line 142d1 of a first semiconductor chip 100g. For example, in the image sensor 1000g according to the current embodiment, a lower surface of the backside contact 110e may contact the first wiring line 142p1 of a first wiring layer 140. In addition, the first wiring line 142d1 of the first wiring layer 140 of a dummy pixel region PAd may be connected to a first wiring line 142p1 of the first wiring layer 140 of a first peripheral region PE1, for example, a first column through via region VCy1 of the first peripheral region PE1. In addition, the backside contact 110e and a through via 130 may extend on an interlayer insulating layer 150 disposed on an upper surface of a first semiconductor substrate 101 and may not be connected to each other while on the interlayer insulating layer 150.

Therefore, in the image sensor 1000g according to the current embodiment, a (−) voltage from a second semiconductor chip 200 may be applied to the conductive layer 122 of each of the DTIs 120 through a second wiring line 212p, the through via 130, the first wiring line 142p1 connected to the through via 130, the first wiring line 142d1 connected to the backside contact 110e, and the backside contact 110e, addition, in the image sensor 1000g according to the current embodiment, the backside contact 110e may be in the form of a square pillar shape and at least one of four sides of the backside contact 110e may contact the conductive layer 122 of each of the plurality of DTIs 120.

Figure 5C:
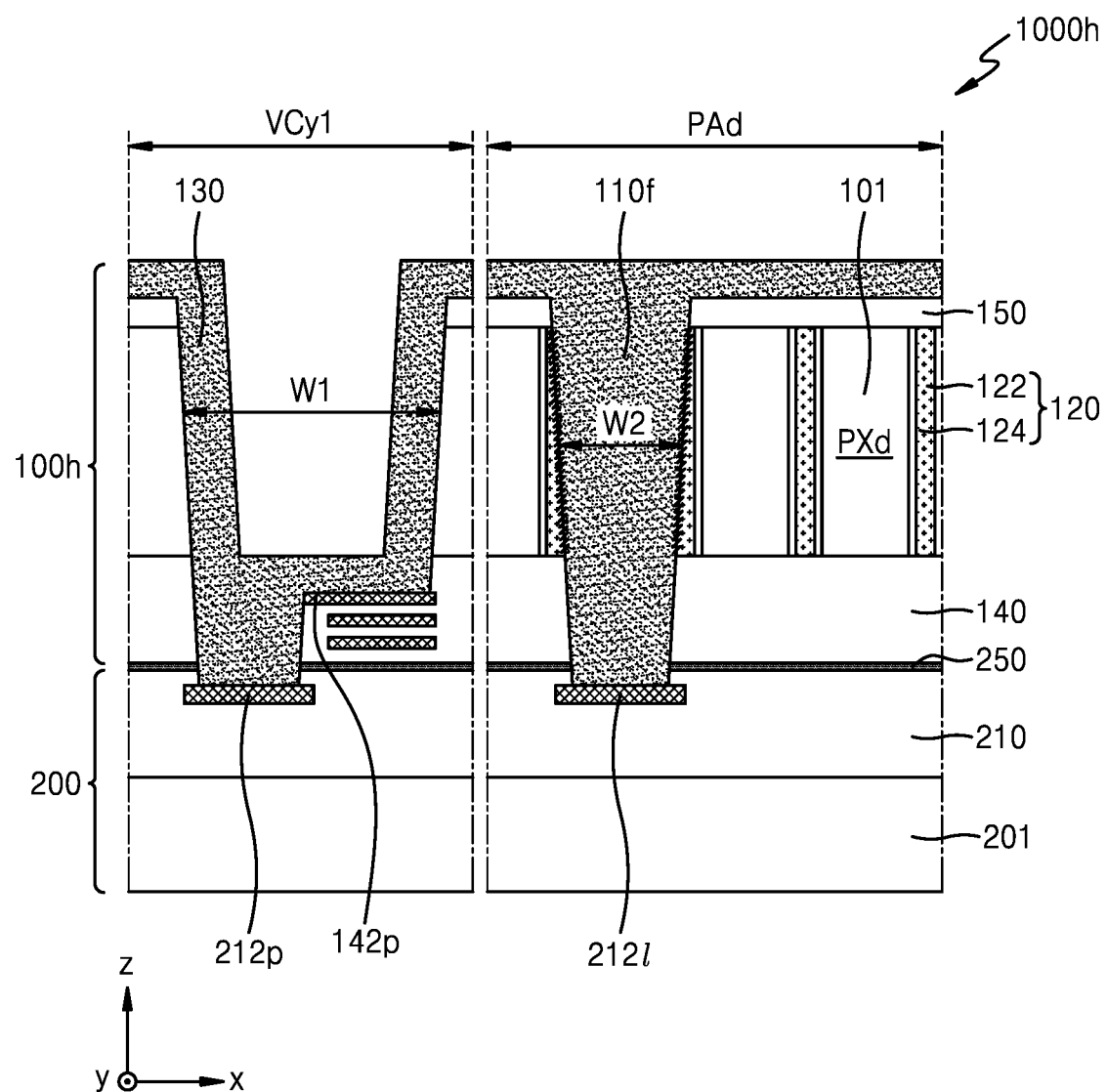

Referring to FIG. 5C, the image sensor 1000h according to an exemplary embodiment of the present inventive concept may be different from the image sensor 1000 of FIG. 2B with regard to a structure of a backside contact 110f. For example, in the image sensor 1000h according to the current embodiment, the backside contact 110f may pass through a first semiconductor chip 100h and a part of a second wiring layer 210. In addition, a lower surface of the backside contact 110f may contact a second wiring line 2121 of the second wiring layer 210. The second wiring line 2121 may be, for example, a (−) voltage application wiring line. In addition, the backside contact 110f and the through via 130 may extend on an interlayer insulating layer 150 disposed on an upper surface of a first semiconductor substrate 101 and may be connected to each other on the interlayer insulating layer 150.

Therefore, in the image sensor 1000h according to the current embodiment, a (−) voltage from a second semiconductor chip 200 may be applied to the conductive layer 122 of each of the DTIs 120 through a second wiring line 212p, the through via 130, and the backside contact 110f, and through the second wiring line 2121 and the backside contact 110f. For example, in the image sensor 1000h according to the current embodiment, the (−) voltage may be applied to the conductive layer 122 of each of the DTIs 120 through two paths. For reference, as more voltage application paths are provided, voltage application characteristics may be improved. In addition, in the image sensor 1000h according to the current embodiment, the backside contact 110f may be in the form of a square pillar shape and at least one of four sides of the backside contact 110f may contact the conductive layer 122 of each of the plurality of DTIs 120.

Figure 5D:
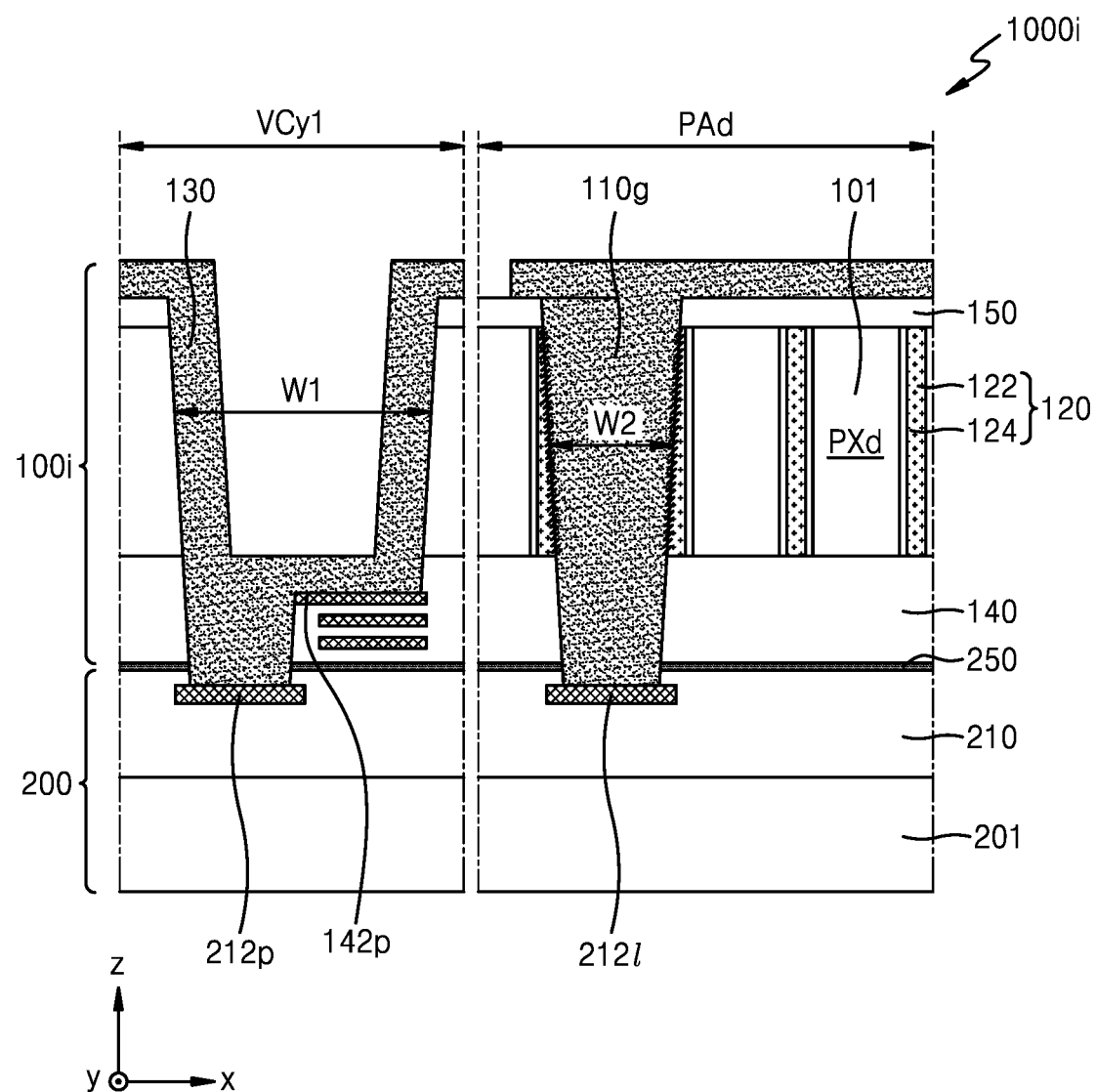

Referring to FIG. 5D, the image sensor 1000i according to an exemplary embodiment of the present inventive concept may be different from the image sensor 1000 of FIG. 2B with regard to a structure of a backside contact 110g. For example, M the image sensor 1000i according to the current embodiment, the backside contact 110g may pass through a first semiconductor chip 100i and a part of a second wiring layer 210. In addition, a lower surface of the backside contact 110g may contact a second wiring line 2121 of the second wiring layer 210. The second wiring line 2121 may be, for example, a (−) voltage application wiring line. In addition, the backside contact 110g and the through via 130 may extend on an interlayer insulating layer 150 disposed on an upper surface of a first semiconductor substrate 101 and may not be connected to each other on the interlayer insulating layer 150.

Therefore, in the image sensor 1000i according to the current embodiment, a (−) voltage from a second semiconductor chip 200 may be applied to the conductive layer 122 of each of the DTIs 120 through the second wiring line 212l and the backside contact 110g. In addition, in the image sensor 1000i according to the current embodiment, the backside contact 110g may be in the form of a square pillar shape, and at least one of four sides of the backside contact 110g may contact the conductive layer 122 of each of the plurality of DTIs 120.

Figure 5E:
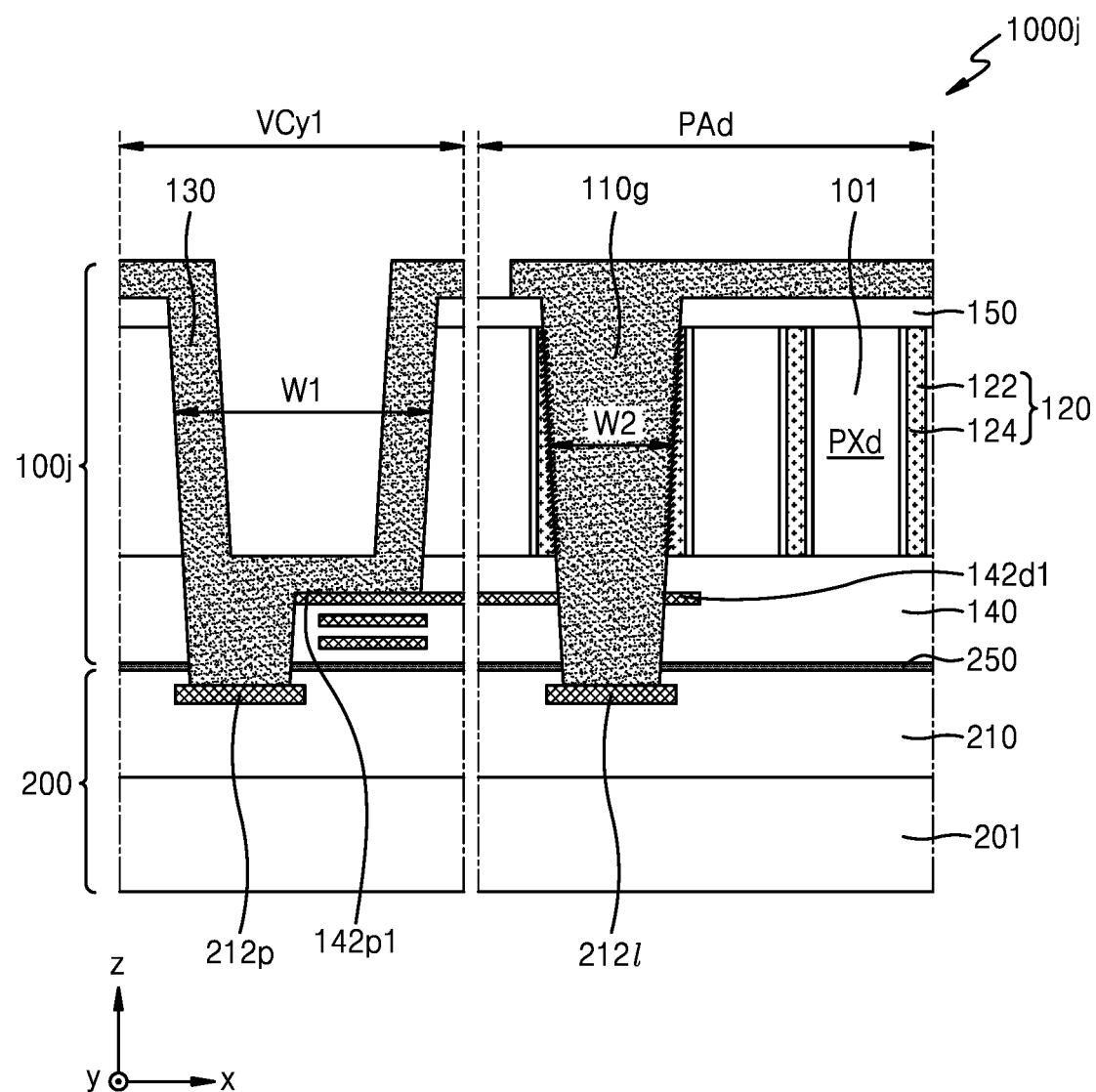

Referring to FIG. 5E, the image sensor 1000j according to an exemplary embodiment of the present inventive concept may be different from the image sensor 1000 of FIG. 2B with regard to structures of a backside contact 110g and a first wiring line 142d1. For example, in the image sensor 1000j according to the current embodiment, the backside contact 110g may pass through a first semiconductor chip 100j and a part of a second wiring, layer 210. In addition, a lower surface of the backside contact 110g may contact a second wiring line 212l of the second wiring layer 210 in the dummy pixel region PAd. The second wiring line 212l may be, for example, a (−) voltage application wiring line. Furthermore, the backside contact 110g may contact the first wiring line 142d1 of a first wiring layer 140, and the first wiring line 142d1 may be connected to a first wiring line 142p1 of the first wiring layer 140 contacting a through via 130 in the first peripheral region. In addition, the backside contact 110g and the through via 130 may extend on an interlayer insulating layer 150 disposed on an upper surface of a first semiconductor substrate 101 and may not be connected to each other on the interlayer insulating layer 150.

Therefore, in the image sensor 1000j according to the current embodiment, a (−) voltage from a second semiconductor chip 200 may be applied to the conductive layer 122 of each of the DTIs 120 through a second wiring line 212p, the through via 130, the first wiring line 142p1 connected to the through via 130, the first wiring line 142d1 connected to the backside contact 110g, and the backside contact 110g, and through the second wiring line 212l and the backside contact 110g. For example, in the image sensor 1000j according to the current embodiment, the (−) voltage may be applied to the conductive layer 122 of each of the DTIs 120 through two paths. In addition, in the image sensor 1000j according to the current embodiment, the backside contact 110g, may be in the form of a square pillar shape, and at least one of four sides of the backside contact 110g may contact the conductive layer 122 of each of the plurality of DTIs 120.

Figure 5F:
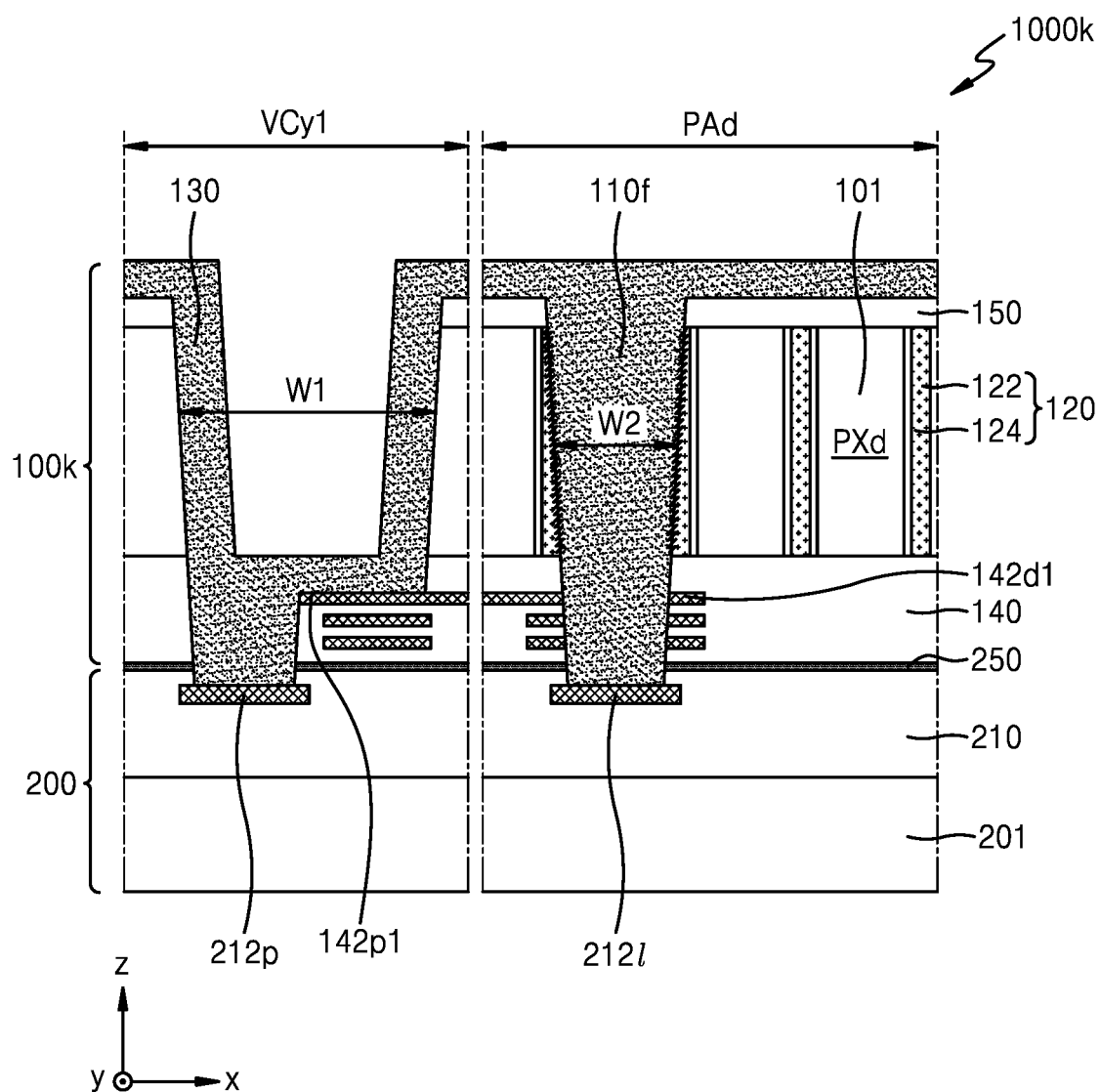

Referring to FIG. 5F, the image sensor 1000k according to an exemplary embodiment of the present inventive concept may be different from the image sensor 1000 of FIG. 2B with regard to structures of a backside contact 110f and a first wiring line 142d1. For example, in the image sensor 1000k according to the current embodiment, the backside contact 110f may pass through a first semiconductor chip 100k and a part of a second wiring layer 210. In addition, a lower surface of the backside contact 110f may contact a second wiring line 212l of the second wiring layer 210 in the dummy pixel region PAd. The second wiring line 212l may be, for example, a (−) voltage application wiring line. Furthermore, the backside contact 110f may contact the first wiring line 142d1 of a first wiring layer 140 of the dummy pixel region Pad, and the first wiring line 142d1 in the dummy pixel region PAd may be connected to a first wiring line 142p1 of the first wiring layer 140 contacting a through via 130 in the first peripheral region PE1. In addition, the backside contact 110f and the through via 130 may extend on an interlayer insulating layer 150 disposed on an upper surface of a first semiconductor substrate 101 and may be connected to each other on the interlayer insulating layer 150.

Therefore, in the image sensor 1000k according to the current embodiment, a (−) voltage from a second semiconductor chip 200 may be applied to the conductive layer 122 of each of the DTIs 120 through a second wiring line 212p, the through via 130, and the backside contact 110f, which is a first path. In addition, the (−) voltage from a second semiconductor chip 200 may be applied to the conductive layer 122 of each of the DTIs 120 through the second wiring line 212p, the through via 130, the first wiring line 142p1 connected to the through via 130, the first wiring line 142d1 connected to the backside contact 110f, and the backside contact 110f, which is a second path, and through the second wiring line 212l and the backside contact 110f which is a third path. For example, in the image sensor 1000k according to the current embodiment, the (−) voltage may be applied to the conductive layer 122 of each of the DTIs 120 through three paths. In addition, in the image sensor 1000k according to the current embodiment, the backside contact 110f may be in the form of a square pillar shape, and at least one of four sides of the backside contact 110f may contact the conductive layer 122 of each of the plurality of DTIs 120.

While the present inventive concept has been described with reference to embodiments thereof, it will be understood by those of ordinary skill in the art that various changes in form and details may be made thereto without departing from the spirit and scope of the present inventive concept.

What is claimed is:

1. An image sensor, comprising:
   a first semiconductor chip comprising a first semiconductor substrate disposed on a first wiring layer in a thickness direction of the image sensor;
   a pixel region and a peripheral region adjacent to the pixel region disposed in the first semiconductor substrate, the pixel region comprising:
   an active pixel region and a dummy pixel region at least partially surrounding the active pixel region; and
   a plurality of pixels arranged in an array structure in the active pixel region and the dummy pixel region, the array structure being disposed perpendicular to the thickness direction, the plurality of pixels being separated from one another by deep trench isolations (DTIs) extending through a thickness of the first semiconductor substrate;
   a second semiconductor chip attached to the first semiconductor chip through an adhesive layer, the second semiconductor chip including logic elements and a second wiring layer;
   a backside contact configured to apply a negative (−) voltage to a conductive layer of a corresponding one of the DTIs, the backside contact being disposed in the dummy pixel region, the backside contact extending through the thickness of the first semiconductor substrate and including a side surface extending along the thickness direction, wherein the backside contact extends through the corresponding one of the DTIs such that the side surface of the backside contact is in contact with the conductive layer of the corresponding one of the DTIs within the first semiconductor substrate; and a through via formed in the peripheral region and configured to connect a first wiring line of the first wiring layer with a second wiring line of the second wiring layer.

2. The image sensor of claim 1, wherein the backside contact is in a form of a square pillar shape corresponding to a dummy pixel in the dummy pixel region, and wherein the backside contact contacts the conductive layer of the corresponding one of the DTIs through at least one of four sides of the square pillar shape.

3. The image sensor of claim 2, wherein all four sides of the square pillar shape, of the backside contact, contact the conductive layer of the corresponding one of the DTIs.

4. The image sensor of claim 2, wherein the backside contact alternates with the dummy pixel and at least partially surrounds the active pixel region.

5. The image sensor of claim 1, wherein the through via passes through the first semiconductor substrate and the first wiring layer, and extends on an upper surface of the first semiconductor substrate, and wherein the backside contact is connected to the through via on the upper surface of the first semiconductor substrate.

6. The image sensor of claim 1, wherein the backside contact contacts wiring lines of the first wiring layer disposed in the dummy pixel region.

7. The image sensor of claim 6, wherein the backside contact has one of a first connection structure, a second connection structure, or a third connection structure, wherein, in the first connection structure, the backside contact is connected to wiring lines of the second wiring layer through the wiring lines of the first wiring layer and a first portion of the through via, wherein, in the second connection structure, the backside contact is connected to the wiring lines of the second wiring layer through a second portion of the through via, and wherein, in the third connection structure, the backside contact is connected to the wiring lines of the second wiring layer through the wiring lines of the first wiring layer and the first portion of the through via and through the second portion of the through via.

8. The image sensor of claim 1, wherein the backside contact passes through the first semiconductor chip and part of the second semiconductor chip and contacts wiring lines of the second wiring layer.

9. The image sensor of claim 1, wherein the backside contact has at least one of a first connection structure, a second connection structure, or a third connection structure, wherein, in the first connection structure, the backside contact is directly connected to a wiring line of the second wiring layer, wherein, in the second connection structure, the backside contact is connected to wiring lines of the second wiring layer through wiring lines of the first wiring layer and a first portion of the through via, and wherein, in the third connection structure, the backside contact is connected to wiring lines of the second wiring layer through a second portion of the through via.

10. The image sensor of claim 1, wherein the through via is formed in a first through hole passing through the first semiconductor substrate and a first wiring layer in the peripheral region, wherein the backside contact is formed in a second through hole passing through the first semiconductor substrate in the dummy pixel region, wherein a horizontal cross-sectional area of the first through hole is greater than a horizontal cross-sectional area of the second through hole, wherein the through via comprises an upper metal layer and a lower metal layer, wherein the upper metal layer is disposed on an intermediate bottom surface and a side surface of the first through hole, and wherein the lower metal layer passes through the first wiring layer and extends to the second wiring layer, and wherein the backside contact comprises a metal layer filled in the second through hole.

11. An image sensor, comprising:

a first semiconductor chip including a first semiconductor substrate disposed on a first wiring layer in a thickness direction of the image sensor, a backside contact passing through the first semiconductor substrate and extending into the first wiring layer, and a pixel region and a peripheral region disposed in the first semiconductor substrate adjacent to the pixel region, the pixel region comprising a plurality of pixels arranged in a two-dimensional array structure;

a second semiconductor chip attached to the first semiconductor chip through an adhesive layer, the second semiconductor chip including a second semiconductor substrate, a second wiring layer disposed on the second semiconductor substrate, and logic elements formed on the second semiconductor substrate; and a through via passing through the first semiconductor substrate and the first wiring layer and extending into the second wiring layer in the peripheral region and connecting wiring lines of the first wiring layer to wiring lines of the second wiring layer, wherein the pixel region comprises an active pixel region and a dummy pixel region at least partially surrounding the active pixel region, wherein the plurality of pixels are separated from one another by deep trench isolations (DTIs) passing through the first semiconductor substrate in the pixel region, and wherein the backside contact is disposed in the dummy pixel region and extends through a corresponding one of the DTIs in the thickness direction of the image sensor such that a side surface of the backside contact is in contact with a conductive layer of the corresponding one of the DTIs.

12. The image sensor of claim 11, wherein the backside contact is in a form of a square pillar shape corresponding to a dummy pixel of the dummy pixel region, and wherein the backside contact is in contact with the conductive layer of the corresponding one of the DTIs through at least one of four sides of the square pillar shape.

13. The image sensor of claim 11, wherein the through via extends on an upper surface of the first semiconductor substrate, and wherein the backside contact is connected to the through via on an upper surface of the first semiconductor substrate.

14. The image sensor of claim 11, wherein the backside contact contacts wiring lines of the first wiring layer in the dummy pixel region, and wherein the wiring lines of the first wiring layer in the dummy pixel region are connected to the through via through wiring lines of the first wiring layer in the peripheral region.

15. The image sensor of claim 11, wherein the backside contact passes through the first wiring layer, extends into the second wiring layer, and directly contacts the wiring lines of the second wiring layer.

16. The image sensor of claim 15, wherein the backside contact is connected to the wiring lines of the second wiring layer through at least one of a first connection structure or a second connection structure, wherein in the first connection structure, the backside contact is connected to wiring lines of the first wiring layer in the dummy pixel region through a side of the backside contact, and
    wherein, in the second connection structure, the backside contact is connected to the through via on an upper surface of the first semiconductor substrate.

17. An image sensor, comprising:
a first semiconductor chip including logic elements;
a second semiconductor chip attached to the first semiconductor chip, the second semiconductor chip including a plurality of pixels electrically connected to the logic elements of the first semiconductor chip through a through via, the plurality of pixels being separated from one another by deep trench isolations (DTIs); and
a backside contact configured to apply a negative (−) voltage to a conductive layer of a corresponding one of the DTIs,
wherein the backside contact includes a pillar shape and the backside contact extends through the corresponding one of the DTIs such that a side surface of the backside contact is in contact with a conductive layer of the corresponding one of the DTIs.

18. The image sensor of claim 17, wherein the second semiconductor chip comprises a semiconductor substrate and a second wiring layer, wherein the plurality of pixels are formed in the semiconductor substrate, wherein the second wiring layer is disposed on the semiconductor substrate, and
    wherein the through via and the backside contact extend through the semiconductor substrate.

19. The image sensor of claim 18, wherein the second semiconductor chip comprises a pixel region and a peripheral region, wherein the plurality of pixels are arranged in the pixel region, and the peripheral region is adjacent to the pixel region,
    wherein the pixel region comprises an active pixel region and a dummy pixel region at least partially surrounding the active pixel region,
    wherein the through via passes through the semiconductor substrate in the peripheral region, and
    wherein the backside contact passes through the semiconductor substrate in the dummy pixel region.

20. The image sensor of claim 19, wherein the backside contact has at least one of a first connection structure, a second connection structure, or a third connection structure, wherein, in the first connection structure, the backside contact passes through the second wiring layer and is connected to wiring lines of a first wiring layer of the first semiconductor chip,
    wherein, in the second connection structure, the backside contact is connected to wiring lines of the first wiring layer of the first semiconductor chip through wiring lines of the second wiring layer and a first portion of the through via, and
    wherein, in the third connection structure, the backside contact is connected to the wiring lines of the first wiring layer of the first semiconductor chip through a second portion of the through via.

* * * * *